(12) United States Patent
Nomizu

(10) Patent No.: US 6,265,997 B1
(45) Date of Patent: Jul. 24, 2001

(54) ARITHMETIC-ENCODING DEVICE AND AN ARITHMETIC-DECODING DEVICE

(75) Inventor: Yasuyuki Nomizu, Ebina (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 09/437,088

(22) Filed: Nov. 9, 1999

(30) Foreign Application Priority Data

Nov. 10, 1998 (JP) .................................................. 10-319144
Jul. 13, 1999 (JP) .................................................. 11-199351

(51) Int. Cl.[7] .................................................. H03M 7/00
(52) U.S. Cl. .................................................. 341/107
(58) Field of Search .................................................. 341/107, 106, 341/65, 67

(56) References Cited

U.S. PATENT DOCUMENTS 6,081,213 * 6/2000 Hosaka .................................. 341/107
6,144,320 * 11/2000 Van Der Vleuten .................. 341/107

FOREIGN PATENT DOCUMENTS 1-222576 9/1989 (JP) .

* cited by examiner

Primary Examiner—Brian Young
(74) Attorney, Agent, or Firm—Oblon, Spivak, McClelland, Maier & Neustadt, P.C.

(57) ABSTRACT

An arithmetic-encoding device including a reference pixels information determining device for determining target pixel information according to a state of a target pixel, and plural types of reference pixels information according to states of plural reference pixels. A predicted probability table storing device stores at least one predicted probability table that includes plural sets of a probable symbol value and a predicted occurrence probability. In addition, an information-conveying device conveys information on the predicted probability table from an external device to the predicted probability table storing device to download the information into the predicted probability table storing device. A predicted probability selecting device selects one of the plural sets of a probable symbol vale and a predicted occurrence probability in the predicted probability table stored in the predicted probability table storing device according to the determined target pixel information and reference pixels information. An arithmetic-encoding device arithmetically encodes the target pixel according to the selected probable symbol and predicted occurrence probability.

51 Claims, 18 Drawing Sheets

FIG. 4

|     | O7  |     |
|-----|-----|-----|
| O10 | O6  |     |
| O9  | O5  | X   |
| O8  | O4  | O2  |
| O3  | O1  |     |

| O1 | O2 | O3 | O4 | O5 | O6 | O7 | O8 | O9 | O10 | STATE INDEX | LPS | PREDICTED PROBABILITY OF LPS | MPS | PREDICTED PROBABILITY OF MPS |
|---|---|---|---|---|---|---|---|---|---|---|---|---|---|---|
| 0 | 0 | 0 | 0 | 0 | 0 | 0 | 0 | 0 | 0 | ST1 | 1 | 0.124 | 0 | 0.876 |
| 1 | 0 | 0 | 0 | 0 | 0 | 0 | 0 | 0 | 0 | ST2 | 0 | 0.288 | 0 | 0.712 |
| 1 | 1 | 0 | 0 | 0 | 0 | 0 | 0 | 0 | 0 | ST3 | 0 | 0.212 | 1 | 0.788 |
| ... | ... | ... | ... | ... | ... | ... | ... | ... | ... | ... | ... | ... | ... | ... |
| 1 | 1 | 1 | 1 | 1 | 1 | 1 | 1 | 1 | 0 | ST1022 | 1 | 0.124 | 1 | 0.876 |
| 1 | 1 | 1 | 1 | 1 | 1 | 1 | 1 | 1 | 0 | ST1023 | 0 | 0.288 | 1 | 0.712 |
| 1 | 1 | 1 | 1 | 1 | 1 | 1 | 1 | 1 | 1 | ST1024 | 0 | 0.212 | 1 | 0.788 |

FIG. 6

| TARGET PIXEL INFORMATION | PROBABLE SYMBOL | | OUTPUT SYMBOL INFORMATION |
|---|---|---|---|
| | LPS | MPS | |
| 1 | 1 | 0 | LPS |
| | 0 | 1 | MPS |
| 0 | 1 | 0 | MPS |
| | 0 | 1 | LPS |

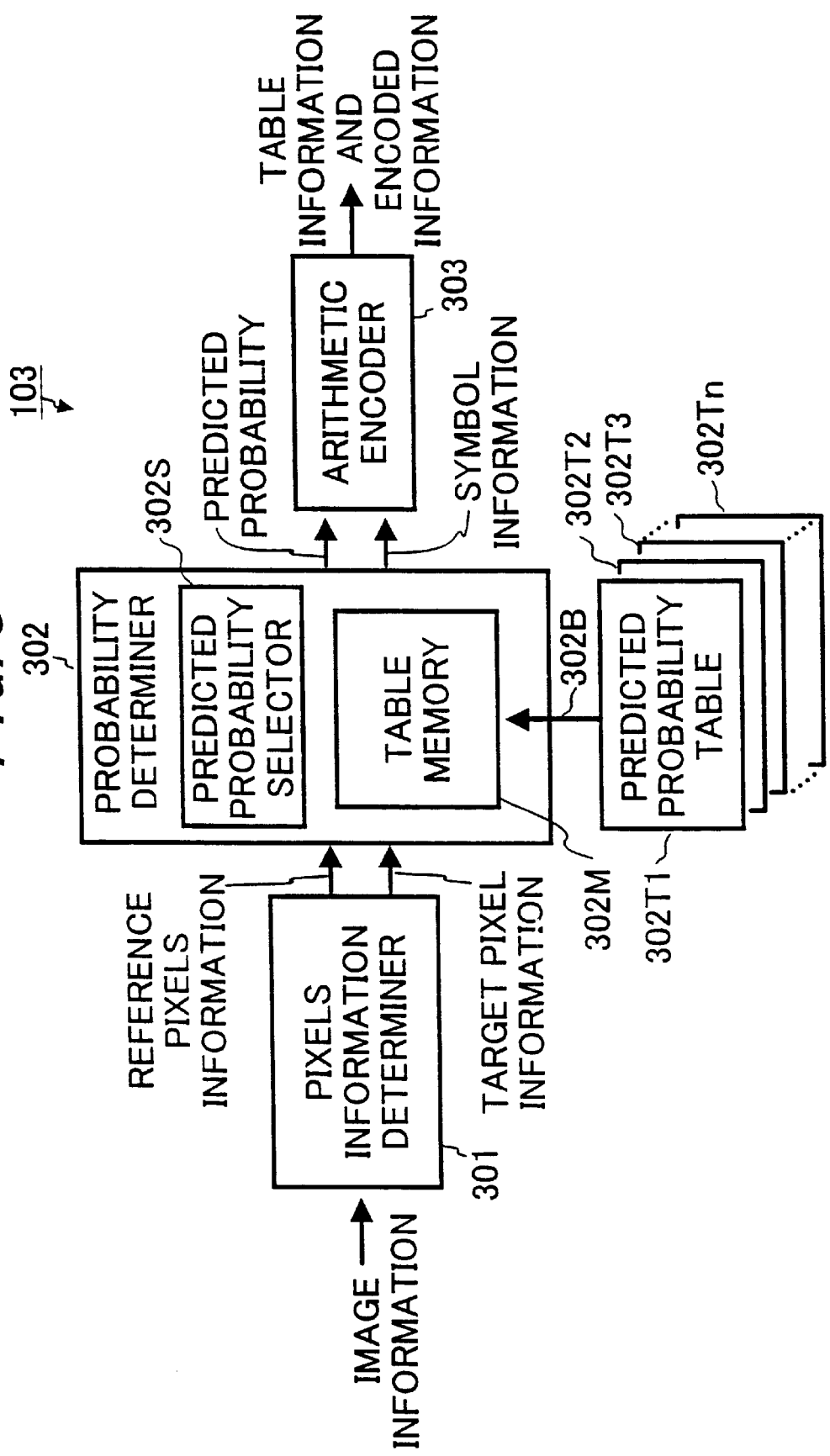

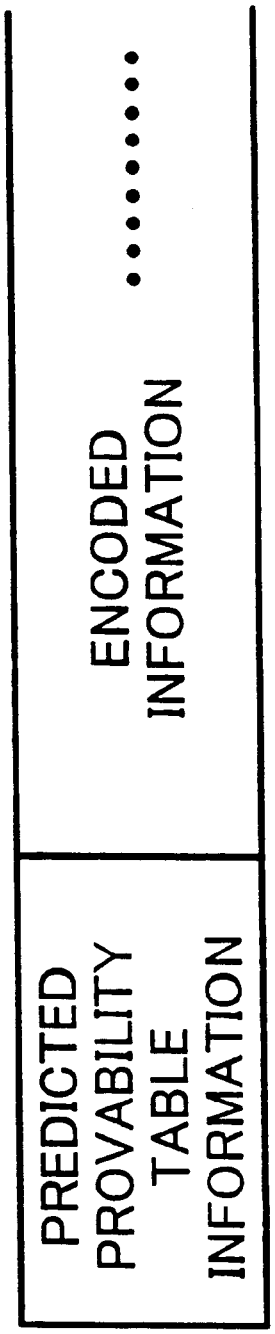
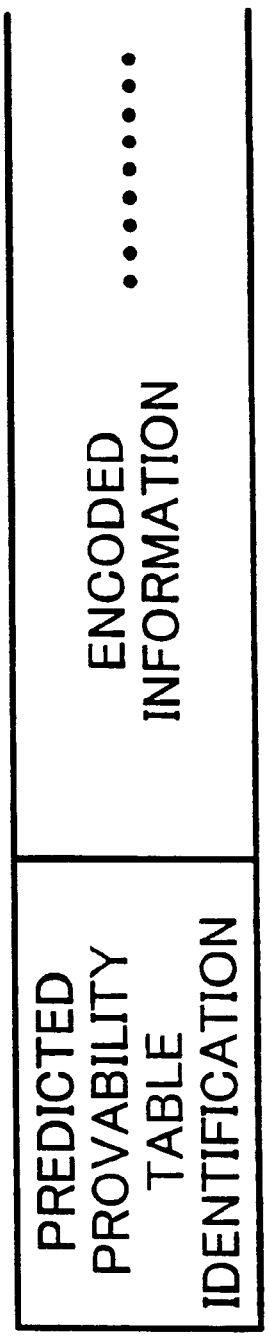

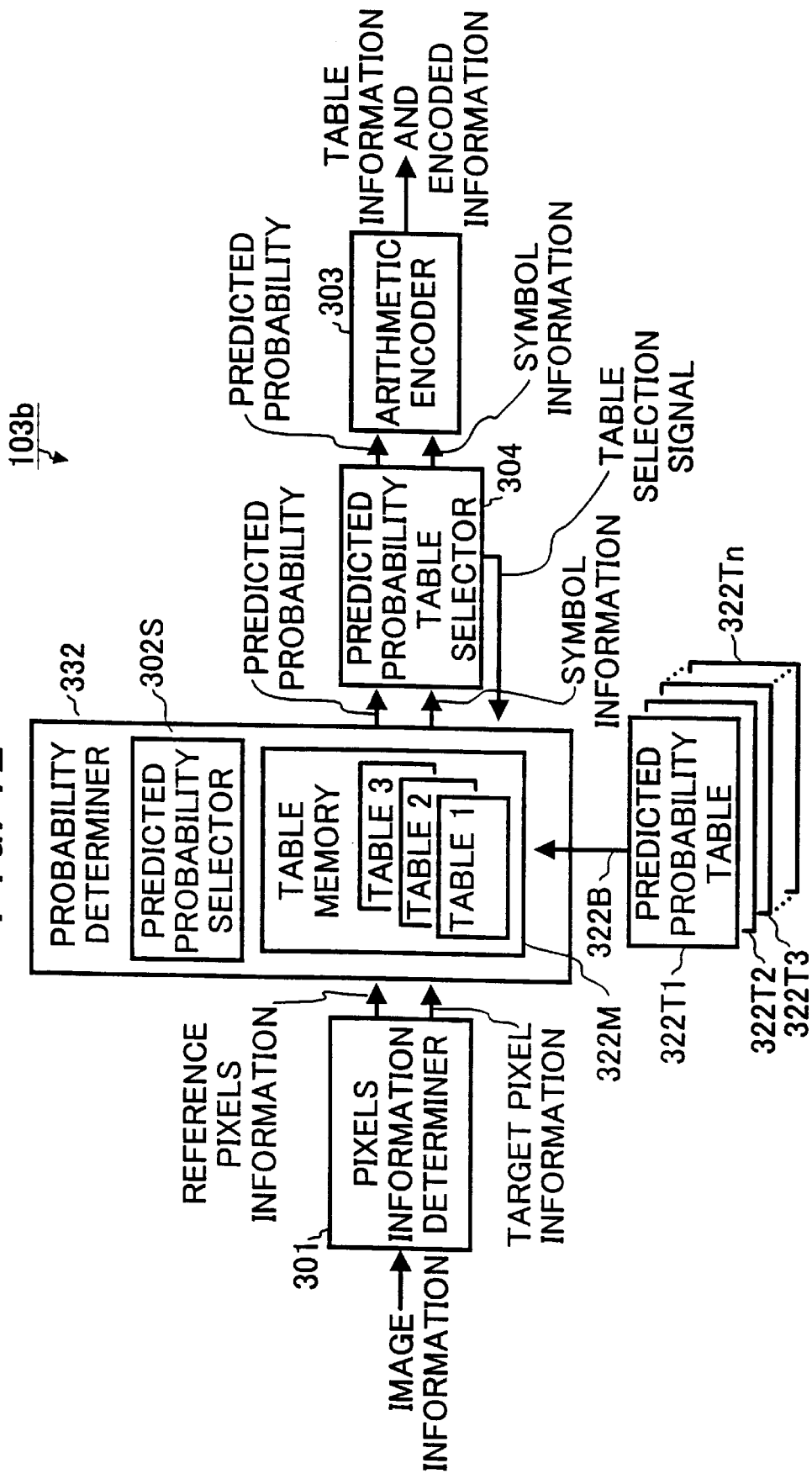

FIG. 13A

| PREDICTED PROVABILITY TABLE INFORMATION | ENCODED INFORMATION | PREDICTED PROVABILITY TABLE INFORMATION | ENCODED INFORMATION ····· |

FIG. 13B

| PREDICTED PROVABILITY TABLE IDENTIFICATION | ENCODED INFORMATION | PREDICTED PROVABILITY TABLE IDENTIFICATION | ENCODED INFORMATION ····· |

ARITHMETIC-ENCODING DEVICE AND AN ARITHMETIC-DECODING DEVICE

BACKGROUND OF THE INVENTION

1. Field of the Invention

The present invention relates to an arithmetic-encoding device and an arithmetic decoding device for compressing and decompressing image information.

2. Discussion of the Background

In recent years, a size of image information processed in an image processing apparatus, such as a digital photocopier and a facsimile machine, has increased as an image resolution and quantity of information per pixel have increased. Accordingly, to process such a large quantity of image information, an increase in the operational speed of the image processing has become important. Further, reducing a transmission time of image information among plural image processing apparatuses has also become important. Thus, a technique for effectively compressing image information, and thereby reducing the transmission time of the image information, is attracting attention.

As image information compression methods for a facsimile transmission system, the Modified Huffman (MH) coding method, the Modified READ (MR) coding method and the Modified MR (MMR) coding method are commonly used. Any of these coding methods achieve a high data compression ratio for a text image and a line image. However, these methods achieve a low data compression ratio for a graphic image, such as a continuous-toned photographic image or a half-toned photographic image processed by a dither-processing method. On the other hand, an arithmetic coding method as a representative example of entropy coding methods is known as an effective data compression method for both a text image and a graphic image.

A known example of the arithmetic coding methods is a QM-coder method, which is standardized as ISO/IEC 11544 by the Telecommunication Standardization Sector of the International Telecommunication Union (ITU-T) and the International Standard Organization (ISO). The QM-coder method generally achieves a high data compression ratio, which is almost close to a limitation that is theoretically obtained, for both a text image and a graphic image. In the arithmetic coding method, a probable symbol, which is a less probable symbol (LPS) or a more probable symbol (MPS), for each of target pixels included in image information is predicted. Further, an occurrence probability of the probable symbol is predicted. Then, the target pixel is encoded according to the symbol information and the occurrence probability information. Therefore, an overall data compression ratio of the image information is high when each hit rate of the prediction for all of the target pixels in the image information is high.

FIG. 1 is a block diagram illustrating a structure of a background QM-coder 20. In FIG. 1, the QM-coder 20 includes a template 21, a probability estimator 22 and an arithmetic encoder 23. The template 21 receives image information (denoted as IMAGE INFORMATION) and successively generates reference pixel information (denoted as REFERENCE PIXEL INFORMATION) and target pixel information (denoted as TARGET PIXEL INFORMATION) with respect to each of the target pixels in the image information.

The probability estimator 22 generates symbol information (denoted as SYMBOL INFORMATION), which is a less probable symbol (LPS) or a more probable symbol (MPS). The probability estimator 22 also generates an estimated occurrence probability of the probable symbol (denoted as ESTIMATED OCCURRENCE PROBABILITY). The symbol information and the estimated occurrence probability are generated according to the target pixel information, the reference pixel information and renewing information for an estimating occurrence probability of the probable symbol (denoted as RENEWING INFORMATION FOR PROBABILITY), which is feedback information sent from the arithmetic encoder 23 as described below.

The arithmetic encoder 23 generates encoded information (denoted as ENCODED INFORMATION) according to the symbol information and the estimated occurrence probability and outputs the encoded information to, for example, a transmission line in a facsimile network system. The arithmetic encoder 23 also generates the renewing information for estimating occurrence probability of a probable symbol and sends the renewing information to the probability estimator 22 to estimate and enhance occurrence probabilities of probable symbols for subsequent target pixels to be encoded.

As described above, the symbol information and the occurrence probability are estimated and then renewed by the probability estimator 22 according to the feedback renewing information so that the occurrence probability of a probable symbol is generally enhanced in proportion to the encoded number of target pixels. As an example, Japanese Laid-open Patent Publication No. 1-222576 describes an arithmetic-encoding method where an occurrence probability of a less probable symbol (LPS) of a picture signal is approximated by a sum of 2's power to enhance the occurrence probability of the probable symbol.

In general, the arithmetic coding method achieves a high data compression ratio, but requires a relatively long processing time to encode and decode image information. For example, the QM-coder method generally achieves a higher data compression ratio than the MH method, which is as an example of a run-length data compression method, However, the QM-coder method requires more operational time to encode and decode image information than the MH method. Consequently, in a facsimile transmission system, for example, an overall operational time to encode image information, transmit the encoded data and decode the encoded data by the MH method is generally shorter than that required by the QM-coder method. Therefore, despite a high data compression ratio of the QM-coder method, the QM-coder method cannot always take full advantage of the compression ratio in an image information system, such as a facsimile network system.

As described above, in the QM-coder method, a target pixel is estimated as either a less probable symbol (LPS) or a more probable symbol (MPS) and an occurrence probability is estimated. Then, the target pixel is encoded according to the estimated probable symbol and the estimated occurrence probability. During the above estimation process, occurrence probabilities of the probable symbols are adaptively renewed as necessary based on a statistic operation according to the feedback signal (denoted as RENEWING INFORMATION FOR PROBABILITY in FIG. 1), to enhance the estimated occurrence probabilities of probable symbols for subsequent target pixels to be encoded. That is, the subsequent target pixels are encoded only after the feedback signal is input to the probability estimator 22. In other words, unless an encoding process for a previous target pixel has been completed, a probability estimation process for a following target pixel cannot be started. Therefore, the operational time for encoding requires a relatively long time.

In addition, because the encoding operation of the QM-coder requires the above-described feedback operation, a so-called "pipeline processing circuit," in which data is input to an input terminal and advanced through a plurality of processing units toward an output terminal in one direction, cannot be applied to an encoding operation of the QM-coder. Therefore, further accelerating of the encoding operation is difficult.

SUMMARY OF THE INVENTION

Accordingly, one object of the present invention is to solve the above and other problems.

Another object of the present invention is to provide a novel arithmetic-encoding device that provides a high speed encoding operation for image information without losing advantages achieved by other data compression methods.

Yet another object of the present invention is to provide a novel arithmetic-decoding device that provides a high speed decoding operation for arithmetically encoding image information without losing advantages achieved by other data compression methods.

To achieve these and other objects, the present invention provides a novel arithmetic-encoding device including a reference pixel information determining device to determine target pixel information according to a state of a target pixel and plural types of reference pixel information according to states of plural reference pixels. Also included is a predicted probability table storing device which stores at least one predicted probability table that includes plural sets of a probable symbol value and a predicted occurrence probability of the probable symbol. Further, an information-conveying device conveys information on the predicted probability table from an external device to the predicted probability table storing device to download the information into the predicted probability table storing device. A predicted probability selecting device selects one of the plural sets of a probable symbol value and a predicted occurrence probability in the predicted probability table stored in the predicted probability table storing device according to the determined target pixel information and reference pixel information. In addition, an arithmetic-encoding device arithmetically encodes the target pixel according to the selected probable symbol and the predicted occurrence probability.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 4 is a diagram illustrating an exemplary template used in the arithmetic-encoding device of FIG. 2;

FIG. 5 is a table illustrating relationships between a state of reference pixels, a probable symbol and a predicted occurrence probability;

FIG. 6 is a table illustrating a relationship between a target pixel, a probable symbol and output symbol information;

FIG. 8 is a block diagram illustrating a structure of an arithmetic-encoding device according to a second embodiment of the present invention;

FIG. 9A is a diagram illustrating an exemplary data format sent from a transmitting facsimile machine having the arithmetic-encoding device of FIG. 8 to a receiving facsimile machine;

FIG. 9B is a diagram illustrating another exemplary data format sent from a transmitting facsimile machine having the arithmetic-encoding device of FIG. 8 to a receiving facsimile machine;

FIG. 12 is a block diagram illustrating a structure of an arithmetic-encoding device according to a fourth embodiment of the present invention;

FIG. 13A is a diagram illustrating an exemplary data format sent from a transmitting facsimile machine having the arithmetic-encoding device of FIG. 12 to a receiving facsimile machine;

FIG. 13B is a diagram illustrating another exemplary data format sent from a transmitting facsimile machine having the arithmetic-encoding device of FIG. 12 to a receiving facsimile machine;

DESCRIPTION OF THE PREFERRED EMBODIMENTS

Figure 1:
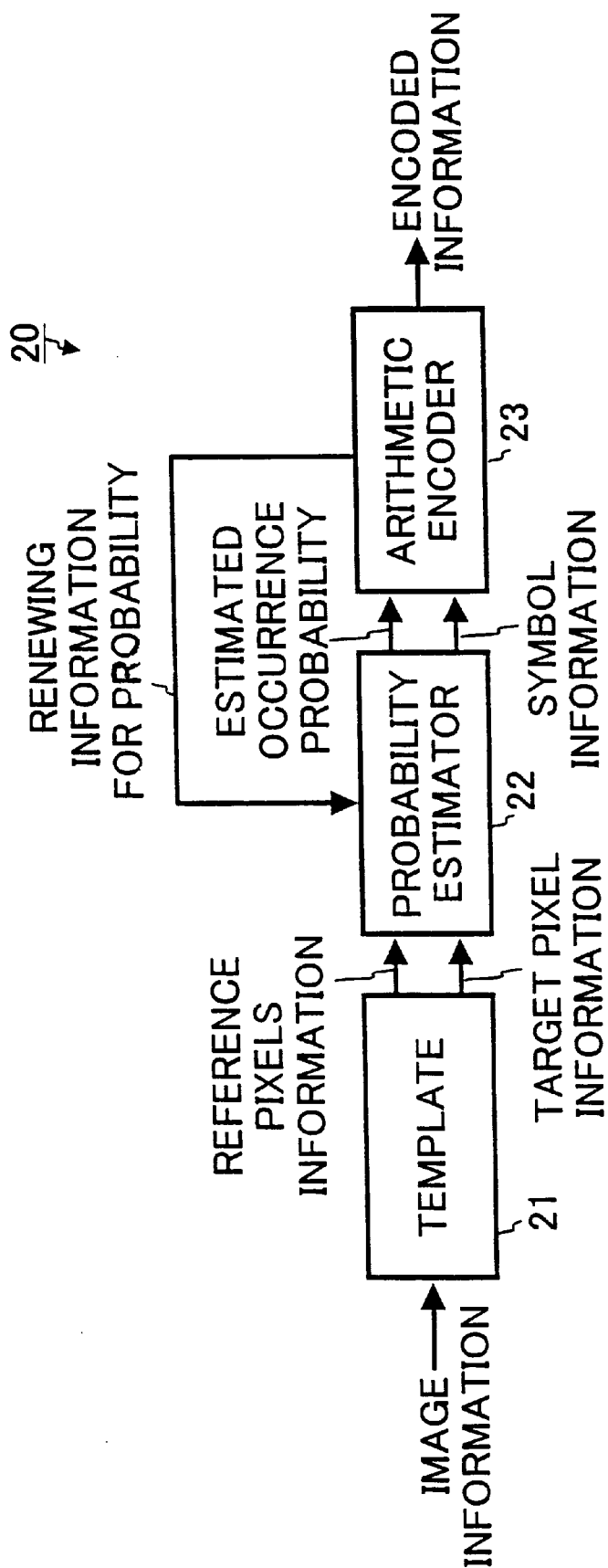
FIG. 1 is a block diagram illustrating a structure of a background QM-coder.

Arithmetic-encoding devices and arithmetic-decoding devices according to embodiments of the present invention are now described with reference to the figures in which like reference numerals indicate identical or corresponding parts throughout the several views.

Figure 2:
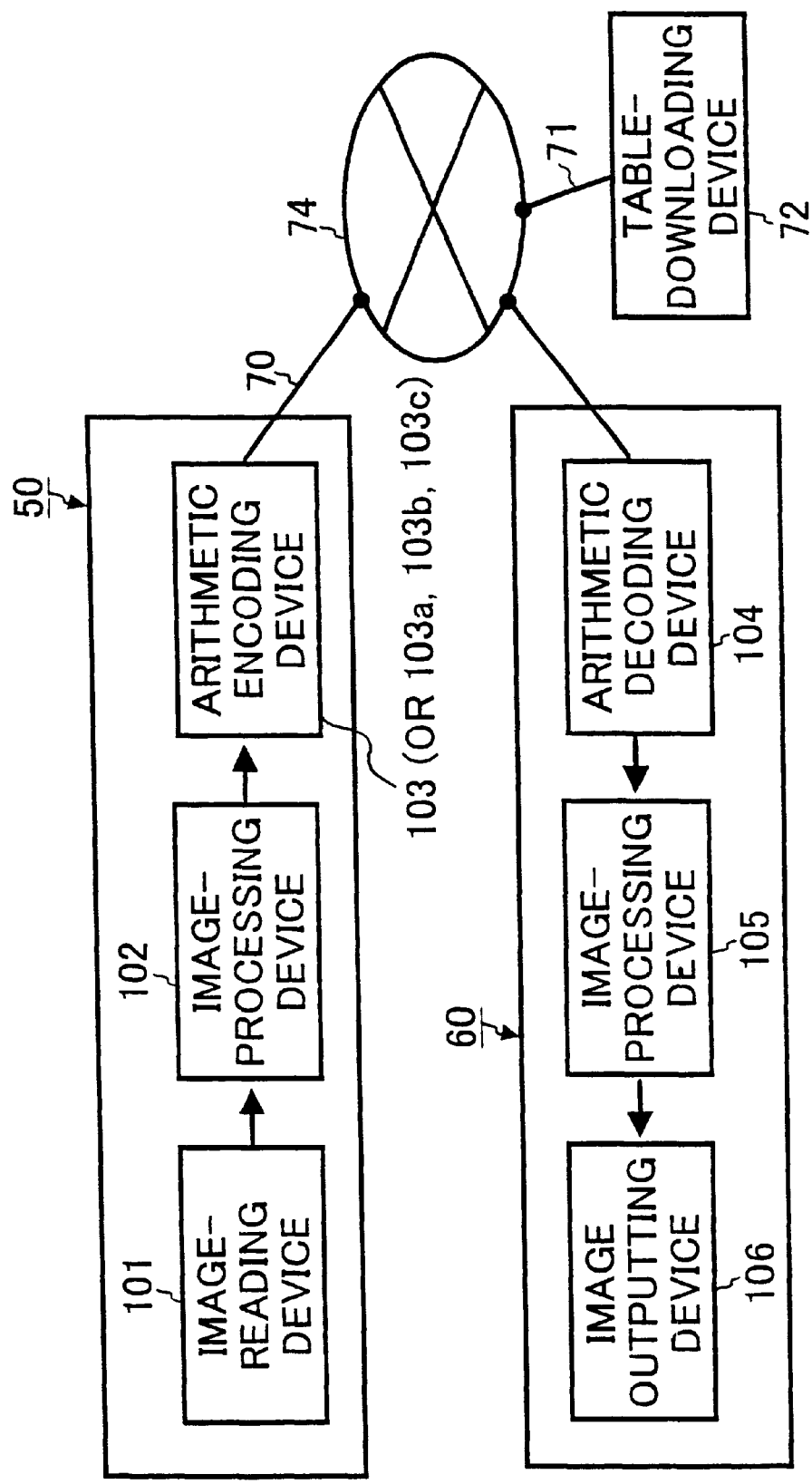
FIG. 2 is a block diagram illustrating structures of facsimile machines each provided with an arithmetic-encoding device and an arithmetic-decoding device according to the present invention.

FIG. 2 is a block diagram illustrating structures of facsimile machines 50 and 60, each provided with an arithmetic-encoding device 103, 103a, 103b or 103c and an arithmetic-decoding device 104, respectively. Referring to FIG. 2, the facsimile machine 50 functions as a transmitting apparatus and the facsimile machine 60 functions as a receiving apparatus. The two facsimile machines 50 and 60, and a table-downloading device 72 are respectively connected to a facsimile network system 74 via a transmission paths 70 and 71.

The transmitting facsimile machine 50 includes an image-reading device 101, an image-processing device 102 and an arithmetic-encoding device 103, 103a, 103b or 103c. The image-reading device 101 reads an original document using an image pickup device, such as a CCD image sensor, and sends the read image signal to the image-processing device 102. The image-processing device 102 converts the image signal into appropriate image information and sends the image information to the arithmetic-encoding device 103, 103a, 103b or 103c. The image-processing device 102 may also perform an image resolution conversion, a document size conversion and a color conversion. The arithmetic-encoding device 103, 103a, 103b or 103c encodes the inputted image information into encoded image information and transmits the encoded image information to the receiving facsimile machine 60 via the transmission path 70 of a facsimile network system.

The receiving facsimile machine 60 includes an arithmetic-decoding device 104, an image-processing device 105 and an image-outputting device 106. The arithmetic-decoding device 104 decodes the received encoded image information into decoded image information and sends the decoded image information to the image-processing device 105. The image-processing device 105 converts the decoded image information into print data and sends the print data to the image-outputting device 106. The image-processing device 105 may also perform an image resolution conversion, a document size conversion and a color conversion. The image-outputting device 106 is, for example, a laser printer, and outputs a hardcopy according to the inputted print data.

Figure 3:
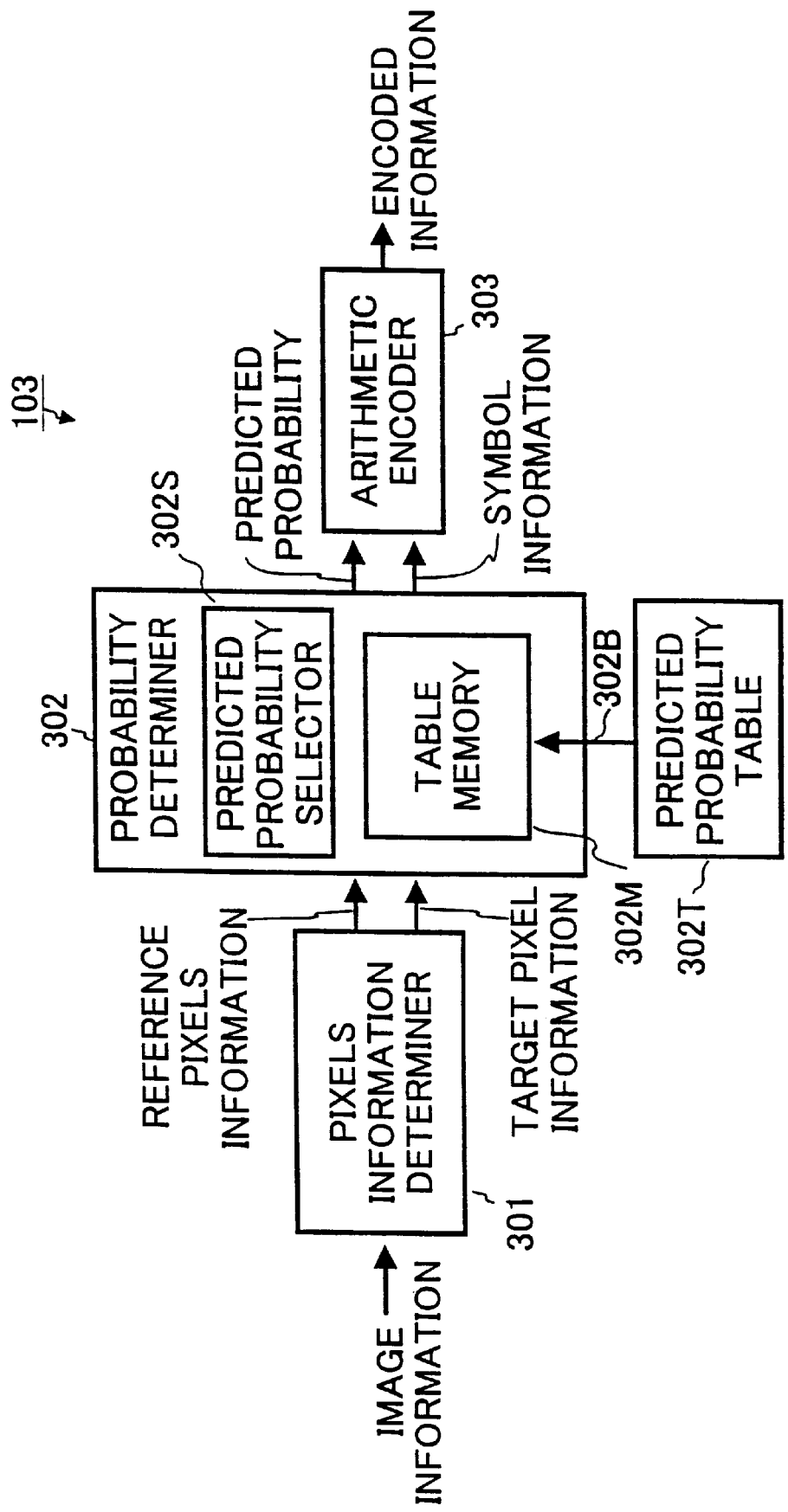
FIG. 3 is a block diagram illustrating a structure of an arithmetic-encoding device according to a first embodiment of the present invention.
Figure 4:
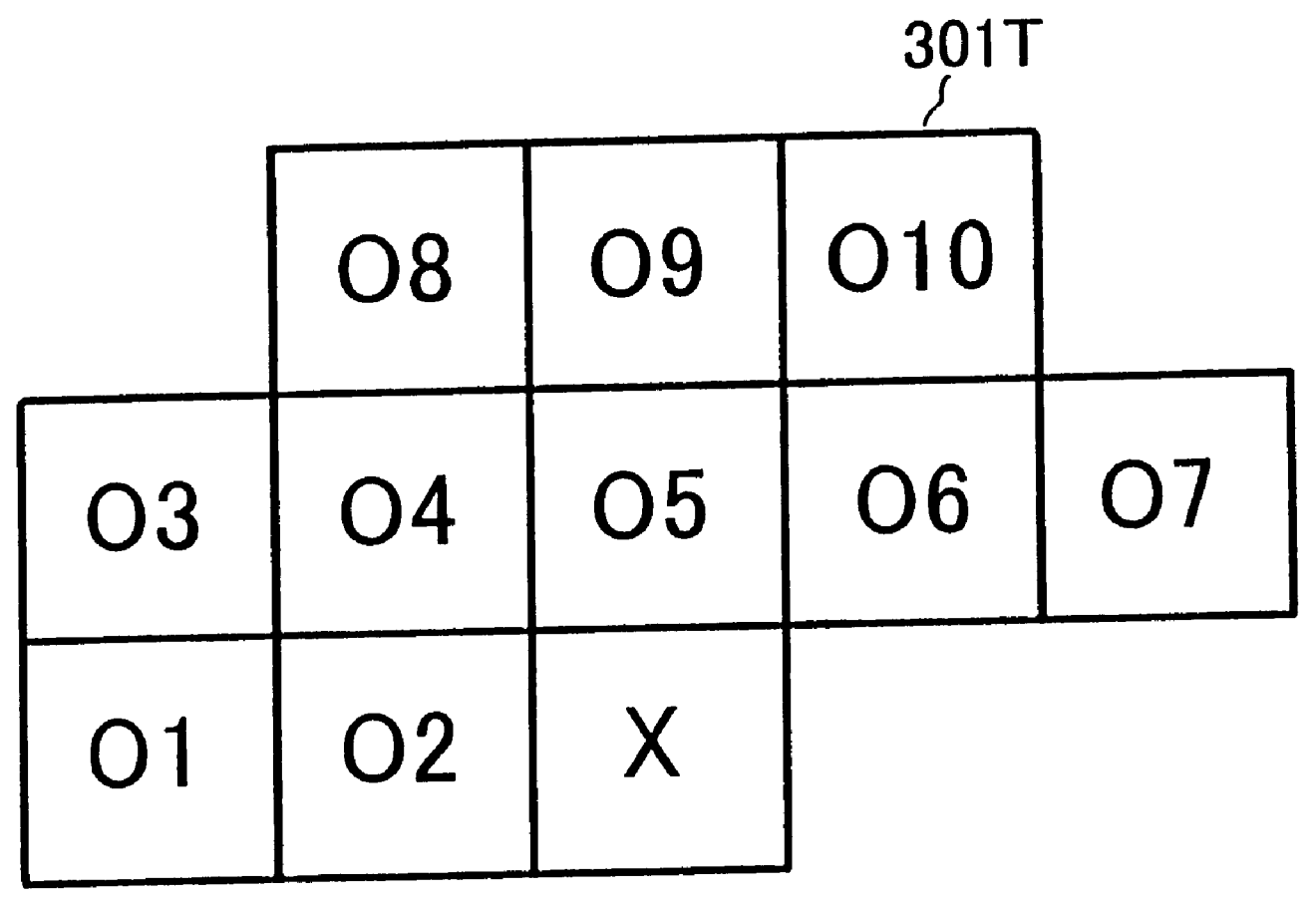

FIG. 3 is a block diagram illustrating a structure of the arithmetic-encoding device 103 of FIG. 2 according to a first embodiment of the present invention. Referring to FIG. 3, the arithmetic-encoding device 103 includes a pixels information determiner 301, a probability determiner 302 and an arithmetic encoder 303. The pixels information determiner 301 includes a template such as the example illustrated in FIG. 4. Referring to FIG. 4, the template 301T has ten reference pixels respectively denoted by O1, O2, O3, O4, O5, O6, O7, O8, O9 and O10, and a target pixel denoted by X. Two reference pixels O1 and O2 are on the same raster scanning line as the target pixel X, five reference pixels O3, O4, O5, O6 and O7 are on a preceding raster scanning line and three reference pixels O8, O9 and O10 are on a raster scanning line two-lines preceding the target pixel X. Because the template 301T has ten reference pixels, the combination of colors of the ten reference pixels, which are black and white in bi-level image information, is 1024. A color of a pixel is also referred as a "state" of the pixel, and therefore the ten reference pixels generate 1024 different states.

Referring to FIG. 3, the pixels information determiner 301 inputs image information denoted as "IMAGE INFORMATION" and determines target pixel information according to a state of the target pixel and reference pixels information according to a state of the reference pixels inside the template 301T. For bi-level image information, the pixels information determiner 301 determines the target pixel information such that when the target pixel is black, the target pixel information is, for example "1" and when the target pixel is white, the target pixel information is "0." The pixels information determiner 301 also determines the reference pixels information as one of the 1024 combinations of the reference pixels. The determined target pixel information and the determined reference pixels information are outputted to the probability determiner 302 as signals respectively denoted as "TARGET PIXEL INFORMATION" and "REFERENCE PIXELS INFORMATION" in FIG. 3.

FIG. 5 is a table illustrating relationships between a state of reference pixels, a probable symbol and a predicted occurrence probability of the probable symbol. In FIG. 5, "O1" to "O10" in a column denote reference pixels, each of which corresponds to the same reference code in the template 301T of FIG. 4. A numerical value "0" or "1" in the same column represents a state of each of the reference pixels. In this embodiment, when a reference pixel is black, the state of reference pixel is referred as "1," and when a reference pixel is white, the state of reference pixel is referred as "0." The "STATE INDEX" denotes a state index code of the combination of the reference pixels, and "ST1" to "ST1024" are state index codes for identifying one of the combinations of the reference pixels. For example, when the reference pixels are 1, 1, 0, 0, 0, 0, 0, 0, 0, 0 each respectively corresponding to "O1" to "O10," then the state index code is referred as "ST3." Either a series of the reference pixels, for example, 1, 1, 0, 0, 0, 0, 0, 0, 0, 0 or a state index can be used to determine reference pixels information. In this embodiment, the state index is input to the probability determiner 302 as the reference pixels information.

Referring back to FIG. 3, the probability determiner 302 includes a predicted probability selector 302S, a data bus 302B and a table memory 302M. The table memory 302M stores a predicted probability table 302T that is downloaded from an external device via the data bus 302B before the arithmetic-encoding device 103 starts encoding image information. The external device may be, for example, a table-downloading device 72 connected to the facsimile network system 74 (FIG. 2). The data bus 302B may also be connected to the facsimile network system 74 to convey and download the data in the predicted probability table 302T (provided in the table-downloading device 72) to the table memory 302M. Further, the predicted probability table 302T may be provided inside the arithmetic-encoding device 103. In this case, the data bus 302B only internally connects to the predicted probability table 302T inside the arithmetic-encoding device 103.

The predicted probability table 302T includes a plurality of sets of reference pixels information, a less probable symbol (LPS) value and a predicted occurrence probability of the LPS. For example, when reference pixels information is sorted into 1024 types of information, the predicted probability table 302T includes 1024 sets of reference pixels information, a less probable symbol (LPS) value and a predicted occurrence probability of the LPS.

Referring to FIG. 5, "LPS" denotes the less probable symbol and a numerical value "1" or "0" is a probable symbol value corresponding to a state index of the reference pixels. The "PREDICTED PROBABILITY OF LPS" denotes a predicted occurrence probability of a LPS and each of the numerical values is a predicted occurrence probability of the LPS respectively corresponding to each state index. Likewise, MPS denotes a more probable symbol and the "PREDICTED PROBABILITY OF MPS" denotes a predicted occurrence probability of the MPS.

When one of a pair of a less probable symbol (LPS) and a predicted occurrence probability and a pair of a more probable symbol (MPS) and a predicted occurrence probability is given, the other pair of a probable symbol and a predicted occurrence probability can be obtained by a calculation based on a statistical formula. Therefore, either one of a pair of a LPS and a predicted occurrence probability and a pair of a MPS and a predicted occurrence probability may be omitted in the predicted probability table 302T. For example, when a probable symbol has two states, such as when image information is bi-level image information, only the predicted occurrence probability of the less probable symbol (LPS) is stored in the table memory 302M. In this case, a predicted occurrence probability of the more probable symbol (MPS) is calculated as "1-the predicted occurrence probability of the LPS." Likewise, when the predicted occurrence probability of the MPS is stored in the table memory 302M, a predicted occurrence probability of the LPS is calculated as "1-the predicted occurrence probability of the MPS." Accordingly, in this embodiment, data in the "STATE INDEX" column, data in the LPS column and data in the "PREDICTED PROBABILITY OF LPS" column are used as data stored in the predicted probability table 302T to be downloaded into the table memory 302M. The above data stored in the predicted probability table 302T is illustrated inside the thick line in FIG. 5.

Referring back to FIG. 3, when target pixel information and reference pixels information is input to the probability determiner 302, the predicted probability selector 302S selects a pair of a probable symbol (i.e., a LPS value and a predicted occurrence probability) according to the inputted reference pixels information. With reference to FIG. 5, for example, if the inputted reference pixels information is "ST3," the predicted probability selector 302S selects a pair of a LPS value "0" and the predicted occurrence probability "0.212." The predicted probability selector 30 always outputs a predicted occurrence probability of the LPS (denoted as "PREDICTED PROBABILITY") to the arithmetic encoder 303 regardless of the state of the target pixel. In the above example, "0.212" is output to the arithmetic encoder 303. The predicted probability selector 302S then determines symbol information to output to the arithmetic encoder 303 as a signal denoted as "SYMBOL INFORMATION".

FIG. 6 is a table illustrating a relationship between a target pixel, a probable symbol and output symbol information. In FIG. 6, "TARGET PIXEL INFORMATION" denotes the target pixel information inputted from the pixels information determiner. "PROBABLE SYMBOL" denotes LPS and MPS. When a LPS value is given, the MPS value for the same target pixel is calculated as "1-LPS value." "OUTPUT SYMBOL INFORMATION" denotes symbol information to be output to the arithmetic encoder 303.

The predicted probability selector 302S determines symbol information to be output to the arithmetic encoder 303 according to the table of FIG. 6. With reference to FIG. 6, for example, when the inputted reference pixels information is "ST3" and the inputted target pixel information is "1," the predicted probability selector 302S finds that the LPS value is "0" according to the predicted probability table 302T, which is substantially equal to a portion of the table of FIG. 5. In this case, the inputted target pixel information does not coincide with the LPS value "0" and the predicted probability selector 302S outputs "MPS" as the symbol information to the arithmetic encoder 303. When the inputted target pixel information coincides with the LPS, the predicted probability selector 302S outputs "LPS" as the symbol information to the arithmetic encoder 303.

Referring back to FIG. 3, when the symbol information, which is LPS or MPS, and a predicted occurrence probability of the LPS are input to the arithmetic encoder 303, the arithmetic encoder 303 encodes the target pixel according to the inputted information based on the arithmetic-encoding method. After the encoding operation, the arithmetic encoder 303 sends the encoded information as a signal denoted as "ENCODED INFORMATION" to a receiving device, such as the receiving facsimile machine 60.

In this arithmetic-encoding method, a numerical interval between a value "0" and a value "1" (between "0.0000 . . . " and "1.0000 . . . " by a binary fraction expression) is recursively divided in proportion to occurrence probabilities of the two symbols "1" and "0," and a series of occurred symbols are recursively allocated in the divided sections. The allocated section is uniquely identified by a real binary fraction, and the real binary fraction is used as encoded information in, for example, a facsimile transmission system, a photocopier, an information storage system and so on.

Figure 7:
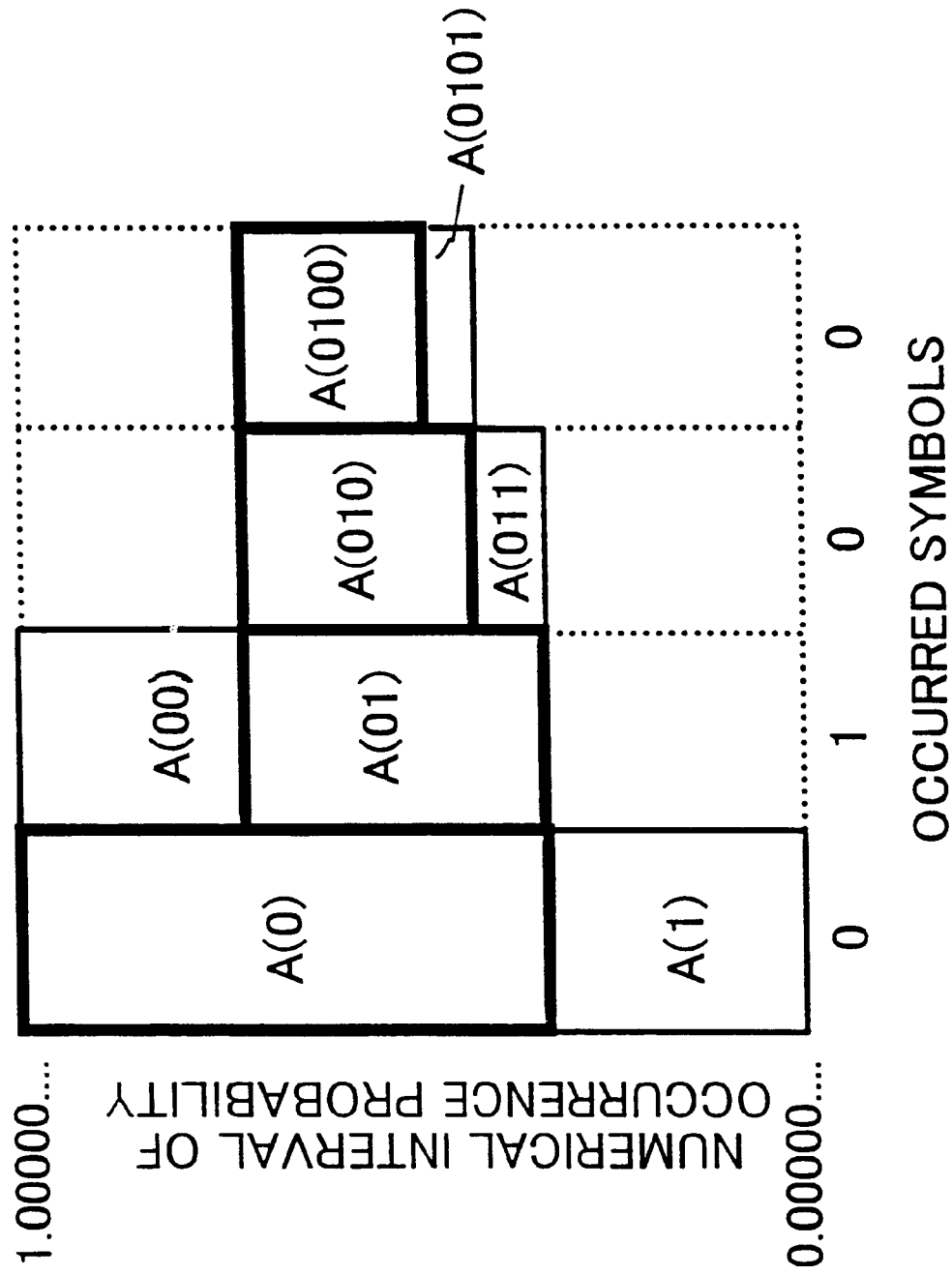
FIG. 7 is a diagram illustrating an arithmetic coding method.

FIG. 7 is a diagram illustrating an arithmetic coding method. In FIG. 7, numerical values 0, 1, 0 and 0 are an example of a series of occurred symbols of image information to be encoded. For the first "0," the numerical interval between a value "0.0000 . . . " and a value "1.0000 . . . " is divided into a section A(0) and a section A(1) in proportion to occurrence probabilities of the two symbols "1" and "0." Then, the inputted first symbol "0" is allocated in the section A(0), which is illustrated with a thick line. Occurrence probabilities of the two symbols "1" and "0" are affected by a state of reference pixels, and thereby the proportion of the section A(0) to the section A(1) is varied according to the state of the reference pixels. For the second "1," the section A(0) is divided into a section A(00) and a section A(01) in proportion to occurrence probabilities of the two symbols "1" and "0" according to a second state of the reference pixels. Inputted symbol "01" is allocated in the section A(01), which is illustrated with a thick line. Likewise, inputted symbol "010" is allocated in a section A(010) and inputted symbol "0100" is allocated in a section A(0100).

A decoding operation of the encoded information by the above-described arithmetic-encoding method is performed inversely to the encoding operation such that a code (i.e., a numerical value expressed by a real binary fraction) is reconverted to a series of symbol of pixels. For an accurate decoding operation, maintaining an equivalence of a width of a numerical interval used at the beginning of the encoding operation and a width of a numerical interval used at the beginning of the decoding operation is important. Generally, both numerical interval widths are initially set to 1.0000000.

As described above, the predicted probability table 302T is not modified according to feedback information during an arithmetic-encoding operation of image information on a document. Therefore, the arithmetic-encoding device 103 may complete the encoding operation of the image information in a short time compared with an arithmetic-encoding device having a feedback information loop. Further, because the arithmetic-encoding device 103 does not provide a feedback loop, the arithmetic-encoding device 103 may be configured by a pipeline circuit to perform the arithmetic-encoding operation.

Text images, such as those created with a personal computer and outputted from a laser printer, are one of the most commonly transmitted documents in a facsimile network system. Therefore, the predicted probability table 302T may be optimized for text images, and be preliminary stored in the table memory 302M. Thereby, the downloading operation of the probability table 302T may be omitted for many of users of facsimile machines installed with the arithmetic-encoding device 103.

FIG. 8 is a block diagram illustrating a structure of the encoding device 103 according to a second embodiment of the present invention. In FIG. 8, the elements that are substantially the same as those in FIG. 3 are denoted by the same reference numerals. Referring to FIG. 8, a plurality of predicted probability tables 302T1, 302T2, 302T3 and 302Tn are provided outside the arithmetic-encoding device 103. Each of the plurality of the predicted probability tables is optimized for a specific image category, such as a text image, a half-toned graphic image, a continuous-toned graphic image and so on. In this embodiment, preceding an encoding operation, the predicted probability table in the table memory 302M is selectively overwritten by another predicted probability table, which is one of the tables 302T1, 302T2, 302T3 and 302Tn, according to an image category of a document to be encoded. Thereby, a data compression ratio is kept high for various documents belonging to various image categories. The downloading table is specified by, for example, an operator of the facsimile machine 50.

When one of the predicted probability tables 302T1, 302T2, 302T3 and 302Tn is selected and downloaded in the arithmetic-encoding device 103, a predicted probability table used in the decoding device 104 of the receiving facsimile machine 60 of FIG. 2 is preferably changed to the same one in the arithmetic-encoding device 103.

FIG. 9A and FIG. 9B are diagrams illustrating exemplary data formats sent from a transmitting device having the encoding device 103 of FIG. 8 (such as the facsimile machine 50 of FIG. 2) to a receiving device (such as the facsimile machine 60 of FIG. 2). In FIG. 9A, "PREDICTED PROBABILITY TABLE INFORMATION" denotes information on the predicted probability table being used in the encoding device 103, for example, the entire data in the predicted probability table 302T. That is, the entire sets of the reference pixels information, the less probable symbol (LPS) value and the predicted occurrence probability of the LPS. In addition, "ENCODED INFORMATION" denotes encoded information by the encoding device 103.

In FIG. 9B, "PREDICTED PROBABILITY TABLE IDENTIFICATION" denotes an identification code of the predicted probability table being used in the encoding device 103, and "ENCODED INFORMATION" denotes encoded information by the encoding device 103. The transmitting facsimile machine 50 sends information about the predicted probability table being currently used in the transmitting facsimile machine 50 to the receiving facsimile machine 60 preceding encoded image information using either one of the data formats of FIG. 9A and FIG. 9B. According to the "PREDICTED PROBABILITY TABLE INFORMATION" or the "PREDICTED PROBABILITY TABLE IDENTIFICATION," the receiving facsimile machine 60 decodes the encoded information using the specified predicted probability table.

Figure 10:
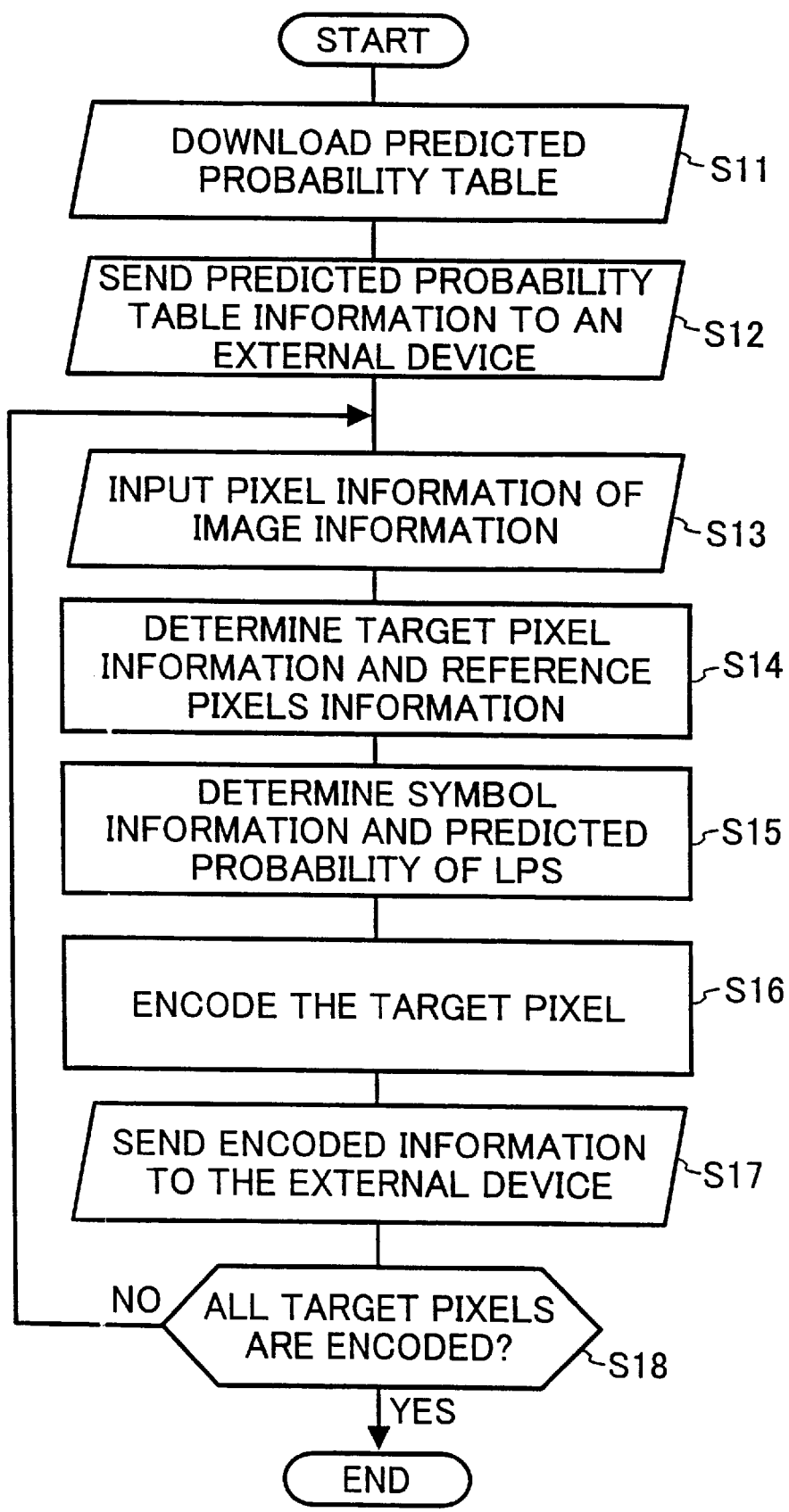
FIG. 10 is a flowchart illustrating operational steps for practicing an image information encoding operation in the arithmetic-encoding devices of FIG. 8.

FIG. 10 is a flowchart illustrating operational steps for practicing an image information encoding operation in the arithmetic-encoding devices 103 of FIG. 8. Referring to FIG. 10, the table memory 302M is downloaded from an external device with a predicted probability table (Step S11). In step S12, the arithmetic-encoding devices 103 sends information about the predicted probability table being currently used to the receiving facsimile machine 60 via the arithmetic encoder 303. In step S13, pixel information on image information is input to the pixels information determiner 301. In step S14, the pixels information determiner 301 determines target pixel information and reference pixels information.

In step S15, the probability determiner 302 determines symbol information and a predicted occurrence probability of the LPS according to the target pixel information and the reference pixels information. In step S16, the arithmetic encoder 303 encodes the target pixel according to the symbol information and the predicted occurrence probability of the LPS. In step S16, the arithmetic-encoding devices 103 sends encoded information to the receiving facsimile machine 60 via the arithmetic encoder 303. In step S17, the arithmetic-encoding devices 103 judges whether all pixels are encoded, and when all pixels are not encoded, the process returns to step S13.

Figure 11:
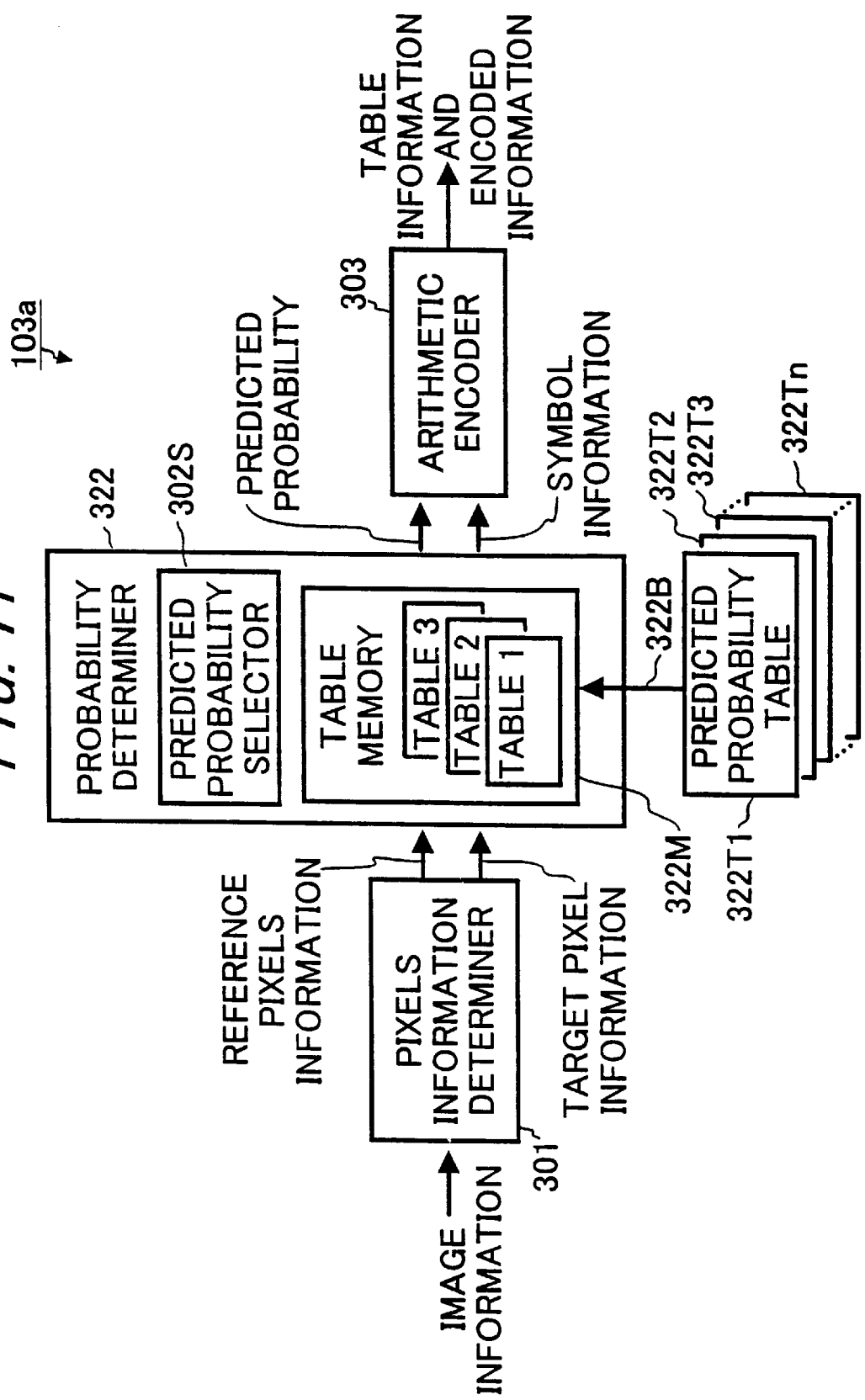
FIG. 11 is a block diagram illustrating a structure of an arithmetic-encoding device according to a third embodiment of the present invention.

FIG. 11 is a block diagram illustrating a structure of an arithmetic-encoding device 103a according to a third embodiment of the present invention. In FIG. 11, the elements that are substantially the same as those in FIG. 3 are denoted by the same reference numerals. Referring to FIG. 11, the arithmetic-encoding device 103a includes a pixels information determiner 301, a probability determiner 322 and an arithmetic encoder 303. The pixels information determiner 301 and the arithmetic encoder 303 operate substantially in the same manner as those denoted by the same reference numerals in FIG. 3. Therefore, the description of these elements is omitted.

The probability determiner 322 includes a predicted probability selector 302S, a data bus 322B and a table memory 322M. The table memory 322M stores a plurality of predicted probability tables, each respectively denoted as "TABLE 1", "TABLE 2" and "TABLE 3." N number of predicted probability tables 322T1, 322T2, 322T3 through 322Tn are provided outside the arithmetic-encoding device 103a, and three of the predicted probability tables are selectively downloaded into the table memory 322M via the data bus 322B. Before image information is input to the encoding device 103a, the probability determiner 322 is specified to use one of the three tables "TABLE 1", "TABLE 2" and "TABLE 3" to generate and output symbol information and a predicted occurrence probability of a LPS by, for example, the operator of the facsimile machine 50.

The more or less probable symbols and predicted occurrence probabilities, change according to an image category of image information even if the reference pixels information is identical. Therefore, a suitable predicted probability table may be optimized depending upon an image category. When an optimized predicted probability table for an image category is used for encoding image information, the encoded data size may be minimized. When the encoding device 103a is implemented in a photocopier or a facsimile machine, the table memory 322M may store plural predicted probability tables, each of which is optimized for a text image, for a half-toned graphic image and for a continuous-toned graphic image, so that the great majority of image information on general documents may be effectively encoded. When some rare image information (i.e., image information that does not belong to the above-described image categories) is encoded, one of the tables "TABLE 1", "TABLE 2" and "TABLE 3" may be replaced with another predicted probability table in the probability tables 322T1, 322T2, 322T3 through 322Tn conveyed through the data bus 322B.

The predicted probability selector 302S operates substantially in the same manner as that denoted by the same reference numeral in FIG. 3. That is, the predicted probability selector 302S selects one of the plural sets of a LPS value and reference pixel information on the LPS specified in one of the tables "TABLE 1", "TABLE 2" and "TABLE 3" and symbol information.

A transmitting device having the encoding device 103a of FIG. 11 (such as the facsimile machine 50 of FIG. 2) sends information regarding the predicted probability table being currently used in the encoding device 103a to a receiving device (such as the facsimile machine 60) preceding encoded image information in substantially the same manner as that of the encoding device 103 of FIG. 8.

FIG. 12 is a block diagram illustrating a structure of an arithmetic-encoding device 103b according to a fourth embodiment of the present invention. In FIG. 12, the elements that are substantially the same as those in FIG. 3 and FIG. 11 are denoted by the same reference numerals. Referring to FIG. 12, the arithmetic-encoding device 103b includes a pixels information determiner 301, a probability determiner 332, a predicted probability table selector 304 and an arithmetic encoder 303. The pixels information determiner 301 and the arithmetic encoder 303 operate substantially in the same manner as in FIG. 3. Therefore, the description of these elements is omitted.

The probability determiner 332 includes a predicted probability selector 302S, a data bus 322B and a table memory 322M. The table memory 322M stores a plurality of predicted probability tables "TABLE 1", "TABLE 2" and "TABLE 3," which are substantially the same as those in FIG. 11. The predicted probability selector 302S also operates substantially in the same manner as in FIG. 11.

The predicted probability table selector 304 generates a table selection signal denoted by "TABLE SELECTION SIGNAL" in FIG. 12 to send to the probability determiner 332 in order to adoptively select one of the three predicted probability tables "TABLE 1", "TABLE 2" and "TABLE 3" in the table memory 322M. The predicted probability selector 304 generates the table selection signal even in the way of an encoding operation of image information on a document. The predicted probability table selector 304 also outputs symbol information as a signal denoted as "SYMBOL INFORMATION" and a predicted occurrence probability of the LPS as a signal denoted as "PREDICTED PROBABILITY" to the arithmetic encoder 303. These two types of information are substantially the same as those denoted by the same reference signal names outputted from the probability determiner 332.

Even when the predicted probability table selector 304 outputs symbol information to the probability determiner 332, the predicted probability table selector 304 may still output these two types of information already received from the probability determiner 332 to the arithmetic encoder 303. In addition, the probability determiner 332 may once inhibit outputting these two types of information, generally information for a single target pixel, until new symbol information and a predicted occurrence probability of the LPS for the same target pixel arrive from the probability determiner 332, which are determined based upon a newly selected predicted probability table.

When the probability determiner 332 received the table selection signal, the probability determiner 332 switches the predicted probability table in use to another predicted probability table specified by the table selection signal. Accordingly, after the table selection signal is received, the probability determiner 332 outputs symbol information and predicted occurrence probability of the LPS based on the newly specified table for the following input target pixels of the image information.

As described above, a predicted probability table may be optimized depending upon a certain image category. Therefore, when a document contains plural categories of image portions in a page and the image information is encoded based upon a single predicted probability table, the encoding operation may be optimized for only one of the plural image portions. In other words, image portions other than the image portion fitting the predicted probability table may not be effectively compressed, and thereby an overall data compression ratio may be deteriorated.

In such an encoding operation of a document including plural image categories, the predicted probability selector 304 generates a table selection signal according to the image information encoded even when encoding image information on a document, such that a predicted probability table in use is changed to another one. Thus, a data compression ratio for the document including plural categories of image portions, such as a text image portion and a graphic image portion, is not deteriorated.

Frequent occurrences of a less probable symbol (LPS) in target symbols are generally caused by an inadequate predicted probability table for an image. Accordingly, as an example of generating methods of the table selection signal, the predicted probability selector 304 counts occurrences of a less probable symbol (LPS). When the number of the occurrences is relatively large, the predicted probability selector 304 can generate a table selection signal. Further, the predicted probability selector 304 can count occurrences of the less probable symbol (LPS) in an adequate predetermined number of target pixels included in a predetermined number of raster scanning lines. The predicted probability selector 304 generates a table selection signal according to the counted number. Because an image category generally changes at a boundary along a raster scanning line, this method achieves a relatively accurate encoding and avoids causing redundant changes of a predicted probability table.

When a predicted probability table is switched to another one in the arithmetic-encoding device 103b, a predicted probability table used in the decoding device 104 of the receiving facsimile machine 60 preferably is also switched to the same predicted probability table as that in the arithmetic-encoding device 103b.

FIG. 13A and FIG. 13B are diagrams illustrating exemplary data formats sent from a transmitting device having the encoding device 103b of FIG. 12 (such as the facsimile machine 50), to a receiving device (such as the facsimile machine 60). In FIG. 13A, "PREDICTED PROBABILITY TABLE INFORMATION" denotes information on the predicted probability table used in the encoding device 103b, for example, the entire data of a predicted probability table, and "ENCODED INFORMATION" denotes encoded information by the encoding device 103b. In FIG. 13B, "PREDICTED PROBABILITY TABLE IDENTIFICATION" denotes information on the predicted probability table used in the encoding device 103b, for example, the identification code of a predicted probability table, "ENCODED INFORMATION" denotes encoded information by the encoding device 103b. When a predicted probability table is switched to another one, the encoding device 103b sends information regarding the predicted probability table currently used to a receiving device, such as the facsimile machine 60, preceding encoded image information based on the predicted probability table using either one of the data formats of FIG. 13A and FIG. 13B.

Figure 14:
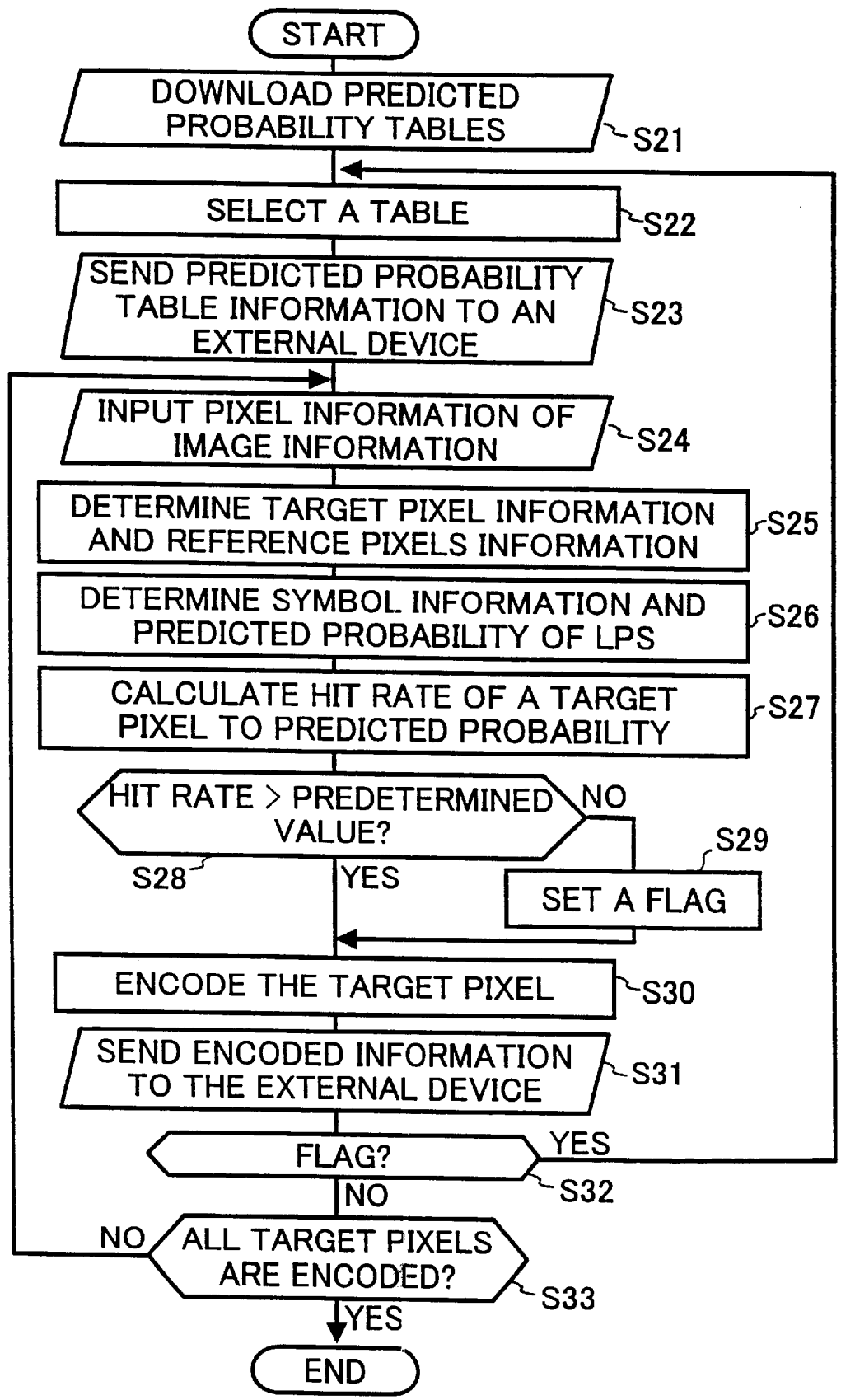
FIG. 14 is a flowchart illustrating operational steps for practicing an image information encoding operation in the arithmetic-encoding devices of FIG. 12.

FIG. 14 is a flowchart illustrating operational steps for practicing an image information encoding operation in the arithmetic-encoding devices 103b of FIG. 12. Referring to FIG. 14, in step S21, the table memory 322M is downloaded with predicted probability tables through the data bus 322B from an external device. In step S22, the probability determiner 302 selects one of predicted probability tables in the table memory 322M according to a predicted probability table selection signal. In step S23, the arithmetic-encoding devices 103b sends information on the predicted probability table currently used to an external device. In step S24, pixel information on image information is input to the pixels information determiner 301. In step S25, the pixels information determiner 301 determines target pixel information and reference pixels information.

In step S26, the probability determiner 302 determines symbol information and a predicted occurrence probability of the LPS according to the target pixel information and the reference pixels information. In step S27, the predicted probability table selector 304 calculates a hit rate of an actually occurred symbol of a target pixel to predicted occurrence symbol. In step S28, the predicted probability table selector 304 judges whether the hit rate is greater than a predetermined value, and when the hit rate is not greater than the predetermined value, the process proceeds to the step S29. In step S29, the predicted probability table selector 304 sets a flag. In step S30, the arithmetic encoder 303 encodes a target pixel according to the symbol information and the predicted occurrence probability of the LPS. In step S31, the arithmetic-encoding devices 103 sends encoded information to the external device. In step S31, the predicted probability table selector 304 judges whether the flag is set, and when the flag is set, the process returns to the step S22. In step S32, the arithmetic-encoding device 103 judges whether all the pixels are encoded. When all the pixels are not encoded, the process returns to the step S24.

Figure 15:
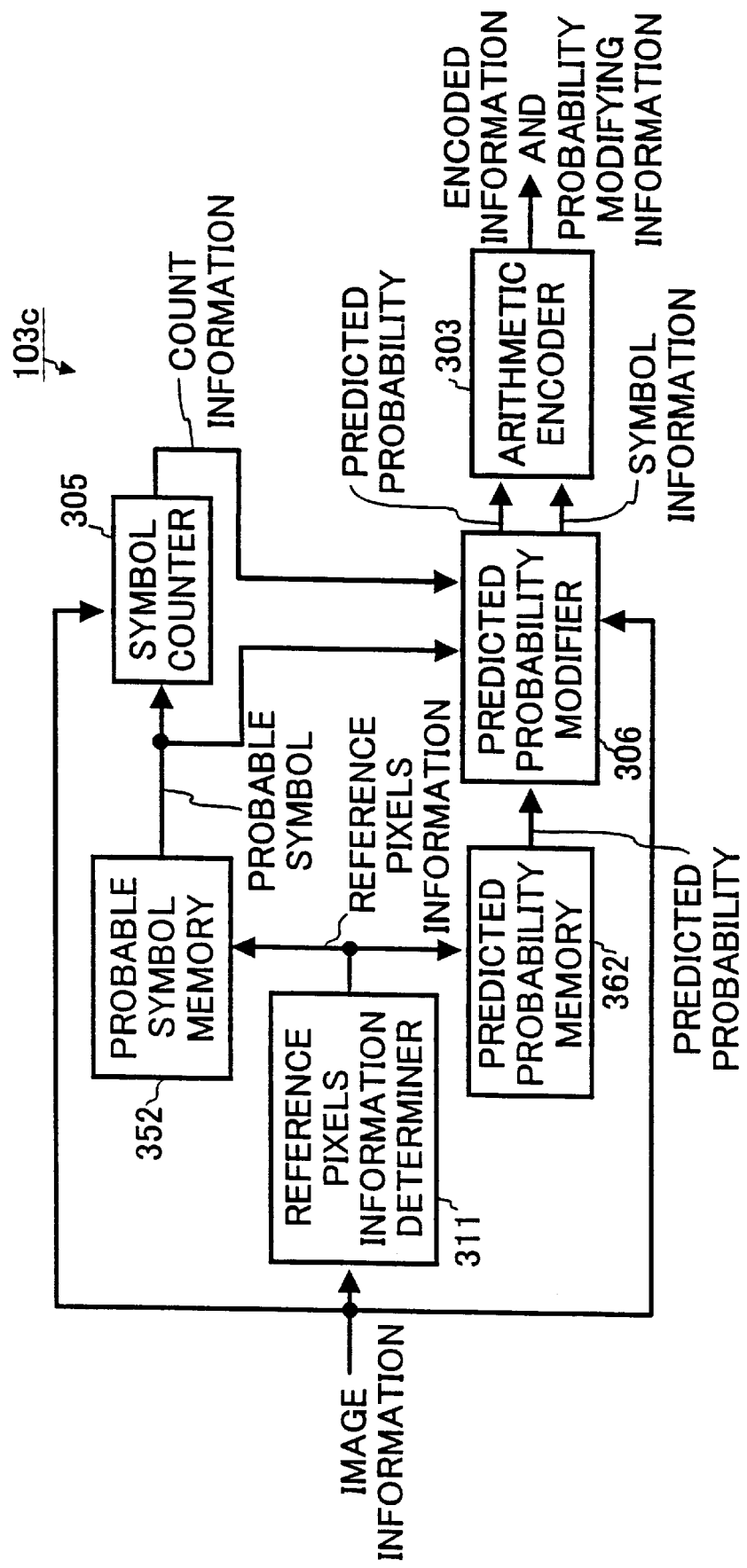
FIG. 15 is a block diagram illustrating a structure of an arithmetic-encoding device according to a fifth embodiment of the present invention.

FIG. 15 is a block diagram illustrating a structure of an arithmetic-encoding device 103c according to a fifth embodiment of the present invention. Referring to FIG. 15, the arithmetic-encoding device 103c includes a reference pixels information determiner 311, a probable symbol memory 352, a predicted probability memory 362, a symbol counter 305, a predicted probability modifier 306 and an arithmetic encoder 303. During an arithmetic-encoding operation in the arithmetic-encoding device 103c, image information denoted by "IMAGE INFORMATION" is input into the reference pixels information determiner 311, the symbol counter 305 and the predicted probability modifier 306.

The reference pixels information determiner 311 inputs image information and determines reference pixels information, denoted as "REFERENCE PIXELS INFORMATION," for a target pixel according to a state of pixels input preceding the target pixel. The reference pixels information determines 311 also outputs the determined reference pixels information to the probable symbol memory 352 and the predicted probability memory 362. The reference pixels information determiner 311 may include a template, for example, such as the template 301T illustrated in FIG. 4 to determine reference pixels information. When the template 301T is used, which has 10 reference pixels denoted by "01" to "010" in FIG. 4, the reference pixels information includes 1024 types of reference pixel information and each information may be referred as a state of the reference pixels.

The probable symbol memory 352 stores a plurality of LPS values each corresponding to one of the plurality of reference pixels information. For bi-level image information, a probable symbol value is either "1" or "0," such as the LPS data in the table of FIG. 5 and the probable symbol values may preliminarily be stored in the probable symbol memory 352. The probable symbol values may also be downloaded into the probable symbol memory 352 from an external device before the decoding operation as necessary. The probable symbol memory 352 may include, for example, a flash memory. When reference pixels information is input to the probable symbol memory 352, the memory 352 outputs a LPS value as a signal denoted as "PROBABLE SYMBOL" according to the inputted reference pixels information to the symbol counter 305 and the predicted probability modifier 306.

The predicted probability memory 362 stores a plurality of a predicted occurrence probability sets of the LPS, each corresponding to one of the plurality of reference pixels information (i.e., a state of the reference pixels). When the predicted probability memory 362 receives the reference pixels information from the reference pixels information determiner 311, the predicted probability memory 362 outputs a predicted probability of the LPS as a signal denoted as "PREDICTED PROBABILITY" according to the information input to the predicted probability modifier 306. The predicted probability memory 362 may preliminarily store the plurality of the predicted occurrence probability and the memory 362 may include a flash memory, for example. The plurality of predicted probability LPS may also be downloaded from an external device before the encoding operation.

The symbol counter 305 counts inputted target pixels included in the image information and the counted number is referred as "N1," for example. The symbol counter 305 also compares an inputted target pixel and a probable symbol input from the probable symbol memory 352 and counts coincidences of the two inputs. In other words, the symbol counter 305 counts events that a probable symbol value (i.e., a LPS value), hits an actually occurred symbol of a target pixel. The counted numerical value of coincidence of the two inputs is referred as "n1," for example. Further, the symbol counter 305 calculates a ratio of the number of coincidences of the two inputs "n1" to a predetermined number of input target pixels "N0" (i.e., "n1/N0"). The values "N1," "n1" and "n1/N0" are sent to the predicted probability modifier 306.

The predicted probability modifier 306 inputs the target pixel information, the values "N1," "n1" and "n1/N0" outputted from the symbol counter 305, the probable symbol outputted from the probable symbol memory 352 and the predicted probability outputted from the predicted probability memory 362. According to these inputs, the predicted probability modifier 306 modifies the inputted probable symbol and the predicted probability as necessary. The predicted probably modifier 306 also outputs the modified probable symbol as a signal denoted as "PROBABLE SYMBOL" and the predicted occurrence probability of the LPS as a signal denoted as "PREDICTED PROBABILITY" to the arithmetic encoder 303.

For modifying a predicted occurrence probability of the LPS, the predicted probability modifier 306 has a first threshold value "th1" and a second threshold value "th2" to compare with the ratio "n1/N0" input from the symbol counter 305. When the ratio "n1/N0" is larger than the first threshold value "th1," the predicted probability modifier 306 modifies a predicted occurrence probability of a LPS outputted from the predicted probability memory 362 to a larger one. For example, when a LPS value is 1, the ratio "n1/N0" is 0.87, the first threshold value "th1" is 0.8 and an inputted predicted occurrence probability of the LPS is 0.212, the predicted probability modifier 306 modifies the inputted predicted occurrence probability 0.212 to a larger one, for example, 0.424, which is double the original one. When the modified probability exceeds 0.5, the modified probability is converted into another value "1-the modified probability"

and the original LPS is converted into "1-the original less probable symbol (LPS)." For example, when the LPS value is 1, the ratio "n1/N0" is 0.87, the first threshold value "th1" is 0.8 and the predicted occurrence probability of the LPS is 0.342, the predicted probability modifier 306 modifies the predicted occurrence 0.342 to a larger one, for example, 0.684. When the modified predicted occurrence probability 0.684 exceeds 0.5, the modified predicted occurrence probability 0.684 is converted into 0.316 (=1−0.684) and the original LPS value 1 is converted into 0 (=1−1).

When the ratio "n1/N0" is smaller than the second threshold value "th2," the predicted probability modifier 306 modifies the predicted occurrence probability of the LPS to a smaller one. For example, when the LPS is 1, the ratio "n1/N0" is 0.26, the second threshold value "th1" is 0.4 and an occurrence probability of the LPS is 0.212, the predicted probability modifier 306 modifies the inputted predicted occurrence probability 0.212 to a smaller one, for example, 0.106, which is half the inputted predicted occurrence probability.

The above-described method (i.e., doubling the data and reducing the data by half) is accomplished by a simple structure such as a data-shift circuit so that the modifying operation may be swiftly executed. Further, the predicted probability modifier 306 may modify the inputted probable symbol and the predicted occurrence probability in another manner. For example, the predicted probability modifier 306 may have a predetermined number "Nc," a third threshold value "th3" and a fourth threshold value "th4." When inputted target pixels "N1" sent from the symbol counter 305 equals to the predetermined number "Nc," the predicted probability modifier 306 compares "n1" with the third threshold value "th3," and compares "n1" with the fourth threshold value "th4."

When "n1" is larger than the third threshold value "th3," the predicted probability modifier 306 modifies the predicted occurrence probability outputted from the predicted probability memory 362 to a larger one in substantially the same manner as described above. When the ratio "n1" is smaller than the fourth threshold value "th2," the predicted probability modifier 306 modifies the predicted occurrence probability to a smaller one in substantially the same manner as described above.

Thus, a predicted occurrence probability becomes closer and closer to an actual occurrence probability of a target pixel to be encoded. Thereby, a data compression ratio by the arithmetic-encoding becomes higher. After these modifications, the predicted probability modifier 306 outputs the selectively modified LSB as a signal denoted as "SYMBOL INFORMATION" and the modified predicted probability as a signal denoted as "PREDICTED PROBABILITY" to the arithmetic encoder 303.

The arithmetic encoder 303 encodes the target pixel according to the inputted modified probable symbol and the modified predicted occurrence probability of the LPS and then sends the encoded data as a signal denoted as "ENCODED IMAGE INFORMATION AND PROBABILITY MODIFYING INFORMATION" to the receiving device, such as a facsimile machine 60.

Figure 16:
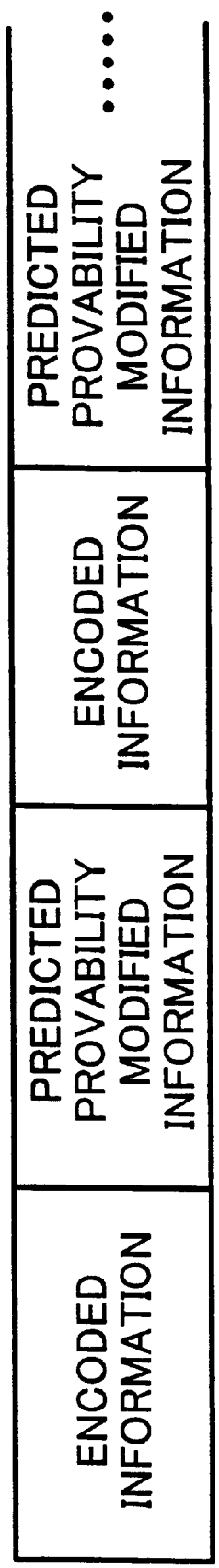
FIG. 16 is a diagram illustrating an exemplary data format sent from a transmitting facsimile machine having the arithmetic-encoding device of FIG. 15 to a receiving facsimile machine.

FIG. 16 is a diagram illustrating an exemplary data format sent from a transmitting device (such as the facsimile machine 50 having the encoding device 103c) to a receiving device (such as the facsimile machine 60). In FIG. 16, "ENCODED INFORMATION" denotes encoded image information by the encoding device 303 and "PREDICTED PROBABILITY MODIFIED INFORMATION" denotes predicted probability modified information in the encoding device 303.

As described above, occurrence probabilities of probable symbol values becomes close to the actual occurrence probabilities despite the occurrence probabilities in the predicted probability memory 362 not being rewritten by a feedback operation. Thereby, the encoding efficiency or the data compression ratio of the encoding is high. In addition, because a feedback loop is not used, the encoding operation may be processed by, for example, a so-called pipeline circuit to further reduce the encoding operation time.

In the above-described method, the timing for modifying a predicted occurrence probability of a probable symbol is important to approximate the predicted occurrence probability to an actual occurrence probability. Otherwise, the modified predicted occurrence probability may degenerate the initial encoding efficiency. In general, when a predicted occurrence probability is modified based on a statistics of pixels included in an integral multiple raster scanning lines, the modification is properly performed and hardware for the modification is simply configured.

Figure 17:
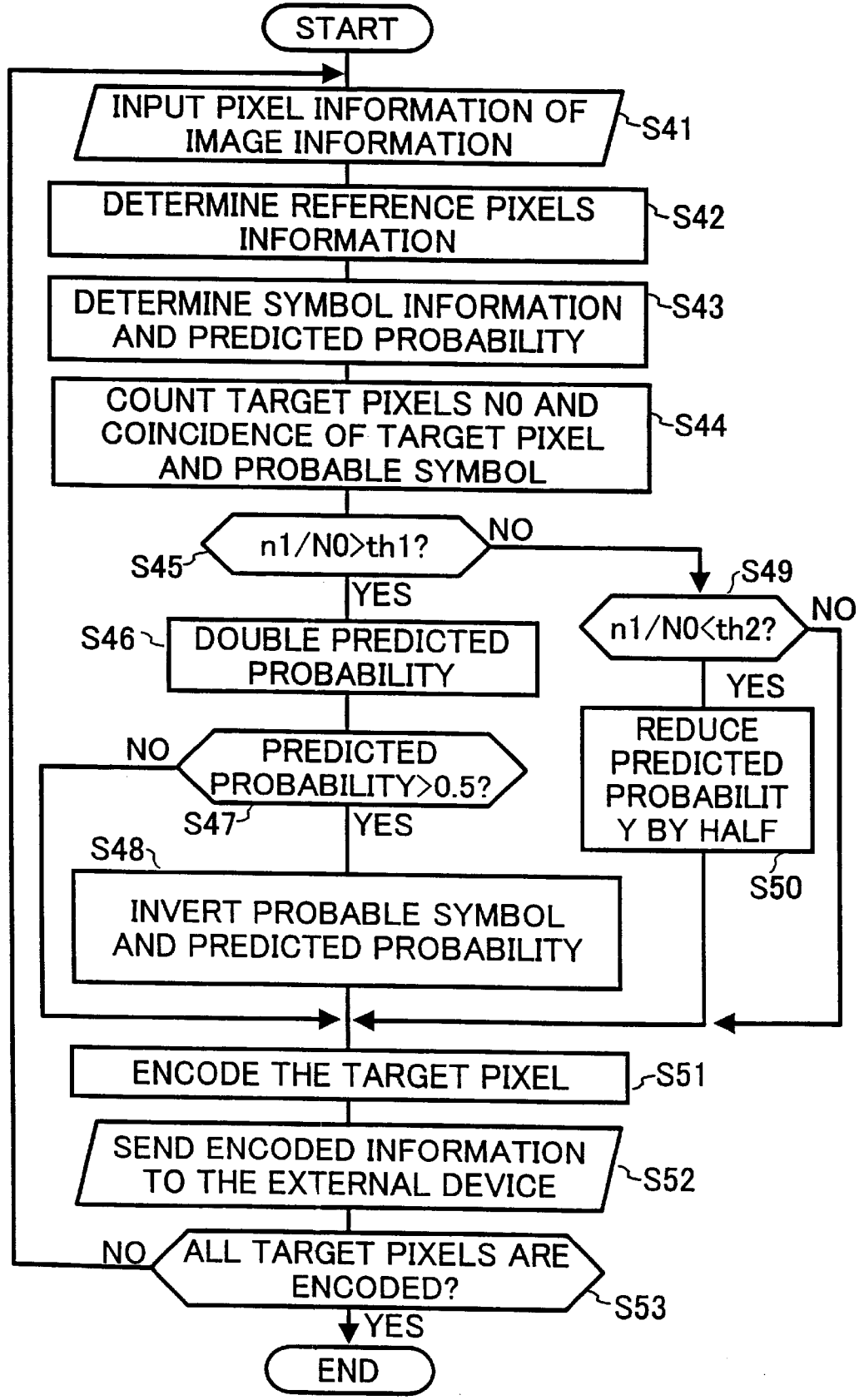
FIG. 17 is a flowchart illustrating operational steps for practicing an image information encoding operation in the arithmetic-encoding devices of FIG. 15.

FIG. 17 is a flowchart illustrating operational steps for practicing an image information encoding operation in the arithmetic-encoding devices 103b of FIG. 15. Referring to FIG. 17, reference pixel information of image information is input to the reference pixels information determiner 311, the symbol counter 305 and the predicted probability modifier 306 (Step S41). In step S42, the reference pixels information determiner 311 determines reference pixels information. In step S43, the probable symbol memory 352 determines a probable symbol and the predicted probability memory 362 determines a predicted occurrence probability of the LPS. In step S44, the symbol counter 305 counts inputted target pixels "N0" and coincidence "n1" of the target pixel and the probable symbol.

In step S45, the predicted probability modifier 306 compares "n1/N0" and a first threshold value "th1." When "n1/N0>th1" the process proceeds to step S46, otherwise the process branches to step S49. In step S46, the predicted probability modifier 306 doubles the inputted predicted occurrence probability. In step S47, the predicted probability modifier 306 compares the doubled predicted occurrence probability and a value 0.5. When the doubled predicted occurrence probability is greater than 0.5, the process proceeds to step S48. Otherwise, the process branches to step S51. In step S48, the predicted probability modifier 306 inverts the probable symbol and the predicted occurrence probability such that "1-probable symbol value" and "1-predicted occurrence probability" is calculated.

In step S49, the predicted probability modifier 306 compares "n1/N0" and a second threshold value "th2." When "n1/N0<th2," the process proceeds to step S50. Otherwise, the process branches to step S51. In step S50, the predicted probability modifier 306 reduces the inputted predicted occurrence probability by half.

In step S51, the arithmetic encoder 303 encodes the target pixel according to the symbol information and the predicted occurrence probability of the LPS. In step S52, the arithmetic-encoding devices 103c sends encoded information to the external device. In step S53, the arithmetic-encoding devices 103c judges whether all the pixels are encoded. When all the pixels are not encoded, the process returns to the step S41.

Figure 18:
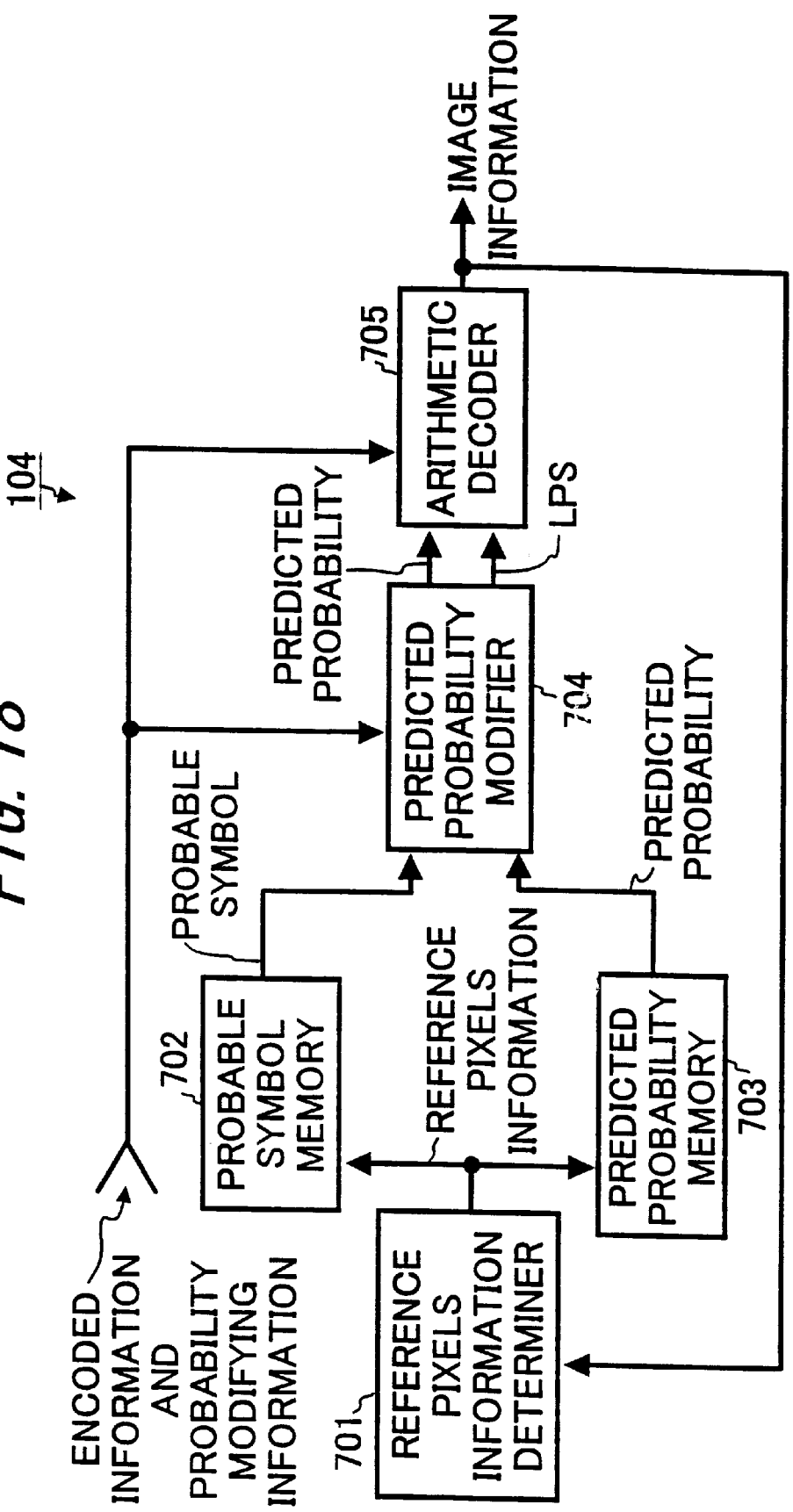
FIG. 18 is a block diagram illustrating a structure of an arithmetic-decoding device according to a sixth embodiment of the present invention.

FIG. 18 is a block diagram illustrating a structure of an arithmetic-decoding device 104 according to a sixth embodiment of the present invention. Referring to FIG. 18, the arithmetic-decoding device 104 includes a reference pixels information determiner 701, a probable symbol memory 702, a predicted probability memory 703, a predicted probability modifier 704 and an arithmetic decoder 705. Encoded image information, which has been encoded by the arithmetic-encoding device 103c of FIG. 15, accompanied with probability modifying information as a signal denoted as "ENCODED INFORMATION AND PROBABILITY MODIFYING INFORMATION" is input into the predicted probability modifier 704 and the arithmetic decoder 705.

The reference pixels information determiner 701 inputs image information as a signal denoted as "IMAGE INFORMATION" output from the arithmetic decoder 705. The reference pixels information determiner 701 also determines reference pixels information for a target pixel according to a state of reference pixels, which are input preceding the target pixel. For determining reference pixels information, the reference pixels information determiner 701 includes a template that is substantially the same one used in an encoding operation for the inputted encoded image information. The reference pixels information determiner 701 outputs the determined reference pixels information as a signal denoted as "REFERENCE PIXELS INFORMATION" to the probable symbol memory 702 and the predicted probability memory 703.

The probable symbol memory 702 stores a plurality of LPS values each corresponding to one of a plurality of reference pixels information, which are substantially the same ones used in the encoding operation for the inputted encoded image information. The stored probable symbol value of a LPS is either "1" or "0" such as the LPS data in the table of FIG. 5. Further, the probable symbol values may preliminarily be stored in the probable symbol memory 702 included, for example, a flash memory. The probable symbol values may also be downloaded into the probable symbol memory 702 from an external device before the decoding operation as necessary. When reference pixels information is input to the probable symbol memory 702, the memory 702 outputs a LPS value as a signal denoted as "PROBABLE SYMBOL" according to the inputted reference pixels information to the predicted probability modifier 704.

The predicted probability memory 703 stores a plurality of predicted occurrence probability of the LPS, each corresponding to one of the plurality of reference pixels information (i.e., the state of reference pixels). The stored plurality of predicted occurrence probability of the LPS are substantially the same ones used in the encoding operation for the inputted encoded image information. The predicted probability memory 703 may preliminarily store a plurality of predicted occurrence probability of the LPS. Further, the memory 703 may include, for example, a flash memory. The plurality of predicted occurrence probability of the LPS may also be downloaded from an external device before the decoding operation. When the predicted probability memory 703 receives reference pixels information from the reference pixels information determiner 701, the predicted probability memory 703 outputs the predicted occurrence probability of the LPS as a signal denoted as "PREDICTED PROBABILITY" according to the received reference pixels information to the predicted probability modifier 704.

The predicted probability modifier 704 receives as inputs the probability modifying information, the encoded information, the probable symbol value outputted from the probable symbol memory 702 and the predicted occurrence probability of the LPS outputted from the predicted probability memory 703. When the predicted probability modifier 704 receives predicted probability modifying information, which is denoted as "PROBABILITY MODIFYING INFORMATION" in FIG. 16, the predicted probability modifier 704 prepares to modify the following predicted occurrence probabilities output from the predicted probability memory 703 according to the received probability modifying information of the decoding operation for the following encoded information inputted. In other words, when the predicted probability modifier 704 receives encoded information following to the above probability modifying information, the predicted probability modifier 704 modifies the predicted occurrence probability of the LPS according the received probability modifying information. Then, the predicted probability modifier 704 outputs symbol information, in this embodiment, only a LPS as a signal denoted "LPS" and the predicted occurrence probability of the LPS as a signal denoted "PREDICTED PROBABILITY" to the arithmetic decoder 705.

The arithmetic encoder 705 decodes the encoded information into decoded image information by an arithmetic-decoding method according to the received LPS and the predicted occurrence probability thereof and outputs the decoded information as a signal denoted by "IMAGE INFORMATION" to the reference pixels information determiner 701 and the image-processing device 105 of FIG. 2.

As described above, because predicted occurrence probabilities of probable symbols in the predicted probability memory 703 are not rewritten by a feedback operation, the decoding operation may be rapidly performed. In addition, the predicted occurrence probabilities of probable symbols are selectively modified by the predicted probability modifier 704. Thereby, the predicted occurrence probabilities of probable symbols are maintained close to actual occurrence probabilities. In other words, the decoding operation is rapidly performed despite a high encoding efficiency or a data compression ratio. Further, because predicted occurrence probabilities of probable symbols in the predicted probability memory 703 are not rewritten by a feedback operation, the decoding operation may be performed by a so-called pipeline circuit to further reducing the decoding operation time.

As described above, the arithmetic-encoding devices of the present invention achieve a high speed encoding operation without losing the advantage over the other methods of data compression ratio.

Further, the arithmetic-decoding devices achieve a high speed decoding operation for arithmetically encoded information without losing the advantages of other data compression ratio methods.

Obviously, numerous additional modifications and variations of the present invention are possible in light of the above teachings. In particular, features described for certain embodiments may be employed in a logical manner to other embodiments described herein. It is therefore to be understood that within the scope of the appended claims, the present invention may be practiced otherwise than as specifically described herein.

This document is based on Japanese patent application No. 10-319144, filed in the Japanese Patent Office on Nov. 10, 1998, and Japanese patent application No. 11-199351 filed in the Japanese Patent Office on Jul. 13, 1999. The entire contents of these applications are incorporated in their entirety by reference.

What is claimed is:

1. An arithmetic-encoding device comprising:
means for determining target pixel information according to a state of a target pixel and plural types of reference pixels information according to states of plural reference pixels;

means for conveying from an external device at least one predicted probability table that includes plural sets of a probable symbol value and a predicted occurrence probability of the probable symbol;

means for storing the at least one predicted probability table;

means for selecting one of the plural sets of the probable symbol value and the predicted occurrence probability in the predicted probability table stored in the storing means according to the determined target pixel information and reference pixels information; and means for arithmetically encoding the target pixel according to the selected probable symbol and the predicted occurrence probability.

2. The arithmetic-encoding device according to claim 1, wherein the storing means initially stores a default predicted probability table that includes plural sets of a probable symbol value and a predicted occurrence probability of the probable symbol that are optimized for image information on a document belonging to a predetermined category of images.

3. The arithmetic-encoding device according to claim 1, wherein the storing means stores a plurality of predicted probability tables, each of which includes plural sets of a probable symbol value and a predicted occurrence probability of the probable symbol value, wherein each of the predicted probability tables is optimized for image information on a document belonging to a predetermined category of images, and wherein one of the plurality of predicted probability tables is selectively used for encoding image information on the document.

4. The arithmetic-encoding device according to claim 3, wherein the storing means stores at least one predicted probability table that is optimized for a text image category and a predicted probability table optimized for a graphic image category.

5. The arithmetic-encoding device according to claim 3, further comprising:

means for judging an image category of image information being encoded; and means for selecting one of the plurality of the predicted probability tables according to a result of the judging means.

6. The arithmetic-encoding device according to claim 5, wherein the judging means judges an image category of the image information being encoded for a predetermined number of input target pixels, and the selecting means selects one of the plurality of the predicted probability tables according to a result of the judging means.

7. The arithmetic-encoding device according to claim 3, further comprising:

means for sending information regarding the predicted probability table selectively used by the arithmetic-encoding device to an arithmetic-decoding device for identifying the predicted probability table for decoding the encoded image information.

8. An arithmetic-encoding device comprising:

means for determining reference pixels information according to a state of plural reference pixels;

first means for storing a plurality of probable symbols, each probable symbol corresponding to one of a plurality of reference pixels information;

means for outputting one of the plurality of probable symbols according to the determined reference pixels information;

second means for storing a plurality of predicted occurrence probabilities of the probable symbols, each predicted occurrence probability corresponding to one of the plurality of the reference pixels information;

means for outputting one of the plurality of predicted occurrence probabilities according to the determined reference pixels information;

means for counting a coincidence of an occurred symbol of a target pixel and a probable symbol of the target pixel output from the first storing means;

means for selectively modifying a predicted probability output from the second storing means and the probable symbol output from the first storing means according to a counted value output from the counting means; and means for arithmetically encoding the target pixel according to the selectively modified probable symbol and the selectively modified predicted occurrence probability.

9. The arithmetic-encoding device according to claim 8, wherein the modifying means increases the predicted occurrence probability output from the second storing means when a ratio of a number of coincidences to a number of input target pixels exceeds a predetermined value.

10. The arithmetic-encoding device according to claim 8, wherein the modifying means increases a predicted occurrence probability when a number of coincidences in a predetermined number of input target pixels exceeds a predetermined value.

11. The arithmetic-encoding device according to claim 8, wherein the modifying means doubles a predicted occurrence probability when a ratio of a number of coincidences to a number of input target pixels exceeds a predetermined value.

12. The arithmetic-encoding device according to claim 8, wherein the modifying means doubles a predicted occurrence probability when a number of coincidences in a predetermined number of input target pixels exceeds a predetermined value.

13. The arithmetic-encoding device according to claim 8, wherein the modifying means decreases a predicted occurrence probability when a ratio of a number of coincidences to a number of input target pixels is less than a predetermined value.

14. The arithmetic-encoding device according to claim 8, wherein the modifying means reduces by half a predicted occurrence probability when a ratio of a number of coincidences to a number of input target pixels is less than a predetermined value.

15. The arithmetic-encoding device according to claim 8, wherein the modifying means selectively modifies the predicted occurrence probability according to a number of coincidences of pixels included in a predetermined number of raster scanning lines forming the image information to be encoded.

16. The arithmetic-encoding device according to claim 8, further comprising:

means for sending information regarding the modified predicted occurrence probability to an encoded image information-receiving device.

17. An arithmetic-decoding device comprising:

means for determining reference pixels information according to a state of plural reference pixels;

first means for storing a plurality of probable symbols, each probable symbol corresponding to one of a plurality of reference pixels information;

means for outputting one of the plurality of probable symbols according to the reference pixels information determined by the determining means;

second means for storing a plurality of predicted occurrence probabilities of the probable symbols, each predicted occurrence probability corresponding to one of the plurality of the reference pixels information;

means for outputting one of the plurality of predicted occurrence probabilities according to the determined reference pixels information;

means for selectively modifying a predicted occurrence probability of the probable symbol output from the second storing means and the probable symbol output from the first storing means according to the probability modifying information sent from an arithmetic-encoding device; and means for arithmetically decoding image information that has been arithmetically encoded according to the selectively modified probable symbol and the selectively modified predicted occurrence probability.

18. An arithmetic-encoding device comprising:

a reference pixels information determiner configured to determine target pixel information according to a state of a target pixel and plural types of reference pixels information according to states of plural reference pixels;

a data bus configured to convey from an external device at least one predicted probability table that includes plural sets of a probable symbol value and a predicted occurrence probability of the probable symbol;

a predicted probability table memory configured to store the at least one predicted probability table;

a predicted probability selector configured to select one of the plural sets of a probable symbol value and a predicted occurrence probability in the predicted probability table stored in the predicted probability table memory according to the determined target pixel information and the reference pixels information; and an arithmetic encoder configured to arithmetically encode the target pixel according to the selected probable symbol and the predicted occurrence probability.

19. The arithmetic-encoding device according to claim 18, wherein the table memory initially stores a default predicted probability table as a default table that includes plural sets of a probable symbol value and a predicted occurrence probability of the probable symbol that are optimized for image information on a document belonging to a predetermined category of images.

20. The arithmetic-encoding device according to claim 18, wherein the table memory stores a plurality of predicted probability tables, each of which includes plural sets of a probable symbol value and a predicted occurrence probability of the probable symbol value, wherein each of the predicted probability tables is optimized for image information on a document belonging to a predetermined category of images, and wherein one of the plurality of predicted probability tables is selectively used for encoding image information on the document.

21. The arithmetic-encoding device according to claim 20, wherein the table memory stores at least one predicted probability table that is optimized for a text image category and a predicted probability table optimized for a graphic image category.

22. The arithmetic-encoding device according to claim 20, further comprising:

a judging mechanism configured to judge an image category of image information being encoded; and a selecting mechanism configured to select one of the plurality of the predicted probability tables according to a result of the judging means.

23. The arithmetic-encoding device according to claim 22, wherein the judging mechanism judges an image category of the image information being encoded for a predetermined number of input target pixels, and the selecting mechanism selects one of the plurality of the predicted probability tables according to a result of the judging means.

24. The arithmetic-encoding device according to claim 20, further comprising:

a sending mechanism configured to send information regarding the predicted probability table selectively used to an encoded image information receiving device for identifying the predicted probability table for decoding the encoded image information.

25. An arithmetic-encoding device comprising:

a reference pixels information determiner configured to determine reference pixels information according to at state of plural reference pixels;

a probable symbol memory configured to store a plurality of probable symbols, each probable symbol corresponding to one of a plurality of reference pixels information;

an output mechanism configured to output one of the plurality of probable symbols according to the determined reference pixels information;

a predicted probability memory configured to store a plurality of predicted occurrence probabilities of the probable symbols, each predicted occurrence probability corrsponding to one of the plurality of the reference pixels information;

an output mechanism configured to output one of the plurality of predicted occurrence probabilities of the probable symbol according to the determined reference pixels information;

a symbol counter configured to count coincidence of an occurred symbol of a target pixel and a probable symbol of the target pixel output from the probable symbol memory;

a predicted probability modifier configured to selectively modify a predicted probability output from the predicted probability memory and the probable symbol output from the probable symbol memory according to a counted value output from the symbol counter; and an arithmetic encoder configured to arithmetically encode the target pixel according to the selectively modified probable symbol and the selectively modified predicted occurrence probability.

26. The arithmetic-encoding device according to claim 25, wherein the predicted probability modifier increases the predicted occurrence probability output from the predicted probability memory when a ratio of a number of coincidences to a number of input target pixels exceeds a predetermined value.

27. The arithmetic-encoding device according to claim 25, wherein the predicted probability modifier means increases a predicted occurrence probability when a number of coincidences in a predetermined number of input target pixels exceeds a predetermined value.

28. The arithmetic-encoding device according to claim 25, wherein the predicted probability modifier means doubles a predicted occurrence probability when a ratio of a number of coincidences to a number of input target pixels exceeds a predetermined value.

29. The arithmetic-encoding device according to claim 25, wherein the predicted probability modifier doubles a predicted occurrence probability when a number of coincidences in a predetermined number of input target pixels exceeds a predetermined value.

30. The arithmetic-encoding device according to claim 25, wherein the predicted probability modifier decreases a predicted occurrence probability when a ratio of a number of coincidences to a number of input target pixels is less than a predetermined value.

31. The arithmetic-encoding device according to claim 25, wherein the predicted probability modifier reduces by half a predicted occurrence probability when a ratio of a number of coincidences to a number of input target pixels is less than a predetermined value.

32. The arithmetic-encoding device according to claim 25, wherein the predicted probability modifier selectively modifies the predicted occurrence probability according to a number of coincidences of pixels included in a predetermined number of raster scanning lines forming the image information to be encoded.

33. The arithmetic-encoding device according to claim 25, further comprising:
a sending mechanism configured to send information regarding the modified predicted occurrence probability to an encoded image information-receiving device.

34. An arithmetic-decoding device comprising:
a reference pixels information determiner configured to determine reference pixels information according to a state of plural reference pixels;
a probable symbol memory configured to store a plurality of probable symbols, each probable symbol corresponding to one of a plurality of reference pixels information;
an output mechanism configured to output one of the plurality of probable symbols according to the determined reference pixels information;
a predicted probability memory configured to store a plurality of predicted occurrence probabilities of the probable symbols, each predicted occurrence probability corresponding to one of the plurality of the reference pixels information;
an output mechanism configured to output one of the plurality of predicted occurrence probabilities of the probable symbol according to the determined reference pixels information;
a predicted probability modifier configured to selectively modify the predicted probability output from the predicted probability memory and the probable symbol output from the probable symbol memory according to probability modifying information sent from an arithmetic-encoding device; and
an arithmetic decoder configured to decode image information that has been arithmetically encoded according to the selectively modified probable symbol and the selectively modified predicted occurrence probability.

35. An arithmetic-encoding method comprising:
determining target pixel information according to a state of a target pixel and plural types of reference pixels information according to states of plural reference pixels;
conveying from an external device at least one predicted probability table that includes plural sets of a probable symbol value and a predicted occurrence probability of the probable symbol;
storing the at least one predicted probability table;
selecting one of the plural sets of the probable symbol value and the predicted occurrence probability in the predicted probability table stored in the storing step according to the determined target pixel information and reference pixels information; and
arithmetically encoding the target pixel according to the selected probable symbol and the predicted occurrence probability.

36. The arithmetic-encoding method according to claim 35, wherein the storing step initially stores a default predicted probability table that includes plural sets of a probable symbol value and a predicted occurrence probability of the probable symbol that are optimized for image information on a document belonging to a predetermined category of images.

37. The arithmetic-encoding method according to claim 35, wherein the storing step stores a plurality of predicted probability tables, each of which includes plural sets of a probable symbol value and a predicted occurrence probability of the probable symbol value,
wherein each of the predicted probability tables is optimized for image information on a document belonging to a predetermined category of images, and
wherein one of the plurality of predicted probability tables is selectively used for encoding image information on the document.

38. The arithmetic-encoding method according to claim 37, wherein the storing step stores at least one predicted probability table that is optimized for a text image category and a predicted probability table optimized for a graphic image category.

39. The arithmetic-encoding method according to claim 37, further comprising:
judging an image category of image information being encoded; and
selecting one of the plurality of the predicted probability tables according to a result of the judging means.

40. The arithmetic-encoding method according to claim 39, wherein the judging step judges an image category of the image information being encoded for a predetermined number of input target pixels, and the selecting step selects one of the plurality of the predicted probability tables according to a result of the judging means.

41. The arithmetic-encoding method according to claim 37, further comprising:
sending information regarding the predicted probability table selectively used to an encoded image information receiving device for identifying the predicted probability table for decoding the encoded image information.

42. An arithmetic-encoding method comprising:
determining reference pixels information according to a state of plural reference pixels;
a first step of storing a plurality of probable symbols, each probable symbol corresponding to one of a plurality of reference pixels information;
outputting one of the plurality of probable symbols according to the determined reference pixels information;
a second step of storing a plurality of predicted occurrence probabilities of the probable symbols each predicted occurrence probability corresponding to one of the plurality of the reference pixels information;
outputting one of the plurality of predicted occurrence probabilities according to the determined reference pixels information;
counting a coincidence of an occurred symbol of a target pixel and a probable symbol of the target pixel output from the first storing means step;

selectively modifying a predicted probability output from the second storing step and the probable symbol output from the first storing step according to a counted value output from the counting means; and arithmetically encoding the target pixel according to the selectively modified probable symbol and the selectively modified predicted occurrence probability.

43. The arithmetic-encoding method according to claim 42, wherein the modifying step increases the predicted occurrence probability output from the second storing step when a ratio of a number of coincidences to a number of input target pixels exceeds a predetermined value.

44. The arithmetic-encoding method according to claim 42, wherein the modifying step increases a predicted occurrence probability when a number of coincidences in a predetermined number of inputted target pixels exceeds a predetermined value.

45. The arithmetic-encoding method according to claim 42, wherein the modifying step doubles a predicted occurrence probability when a ratio of a number of coincidences to a number of input target pixels exceeds a predetermined value.

46. The arithmetic-encoding method according to claim 42, wherein the modifying step doubles a predicted occurrence probability when a number of coincidences in a predetermined number of input target pixels exceeds a predetermined value.

47. The arithmetic-encoding method according to claim 42, wherein the modifying step decreases a predicted occurrence probability when a ratio of a number of coincidences to a number of input target pixels is less than a predetermined value.

48. The arithmetic-encoding method according to claim 42, wherein the modifying step reduces by half a predicted occurrence probability when a ratio of a number of coincidences to a number of input target pixels is less than a predetermined value.

49. The arithmetic-encoding method according to claim 42, wherein the modifying step selectively modifies the predicted occurrence probability according to a number of coincidences of pixels included in a predetermined number of raster scanning lines forming the image information to be encoded.

50. The arithmetic-encoding method according to claim 42, further comprising:

sending information regarding the modified predicted occurrence probability to an encoded image information-receiving device.

51. An arithmetic-decoding method comprising:

determining reference pixels information according to a state of plural reference pixels;

a first means of storing a plurality of probable symbols, each probable symbol corresponding to one of a plurality of reference pixels information;

outputting one of the plurality of probable symbols according to the reference pixels information determined by the determining means;

a second step of storing a plurality of predicted occurrence probabilities of the probable symbols each predicted occurrence probability corresponding to one of the plurality of the reference pixels information;

outputting one of the plurality of predicted occurrence probabilities according to the determined reference pixels information;

selectively modifying a predicted occurrence probability of the probable symbol output from the second storing step and the probably symbol output from the first storing step according to probability modifying information sent from an arithmetic-encoding device; and arithmetically decoding image information that has been arithmetically encoded according to the selectively modified probable symbol and the selectively modified predicted occurrence probability.

* * * * *